(12) United States Patent
Ema et al.

(10) Patent No.: US 9,105,743 B2
(45) Date of Patent: Aug. 11, 2015

(54) SEMICONDUCTOR DEVICE AND METHOD OF MANUFACTURING SEMICONDUCTOR DEVICE

(71) Applicant: FUJITSU SEMICONDUCTOR LIMITED, Yokohama-shi, Kanagawa (JP)

(72) Inventors: Taiji Ema, Yokohama (JP); Kazushi Fujita, Yokohama (JP); Junji Oh, Yokohama (JP)

(73) Assignee: FUJITSU SEMICONDUCTOR LIMITED, Yokohama (JP)

( * ) Notice: Subject to any disclaimer, the term of this patent is extended or adjusted under 35 U.S.C. 154(b) by 0 days.

(21) Appl. No.: 14/265,860

(22) Filed: Apr. 30, 2014

(65) Prior Publication Data

US 2014/0235022 A1 Aug. 21, 2014

Related U.S. Application Data

(62) Division of application No. 13/625,176, filed on Sep. 24, 2012, now Pat. No. 8,766,369, which is a division of application No. 13/172,224, filed on Jun. 29, 2011, now Pat. No. 8,294,217.

(30) Foreign Application Priority Data

Sep. 30, 2010 (JP) .................................. 2010-220774

(51) Int. Cl.
*H01L 21/8238* (2006.01)
*H01L 21/8234* (2006.01)
(Continued)

(52) U.S. Cl.
CPC ...... *H01L 21/823418* (2013.01); *H01L 21/761* (2013.01); *H01L 21/823857* (2013.01);
(Continued)

(58) Field of Classification Search
CPC ..................... H01L 21/761; H01L 21/823857; H01L 21/823878; H01L 29/1083; H01L 29/665; H01L 27/0928

USPC .......................................... 438/199, 291, 289
See application file for complete search history.

(56) References Cited

U.S. PATENT DOCUMENTS 6,482,714 B1 11/2002 Hieda et al.
2004/0071030 A1* 4/2004 Goda et al. .................... 365/222
(Continued)

FOREIGN PATENT DOCUMENTS

JP 2006-278974 A 10/2006
JP 2006-303189 A 11/2006

OTHER PUBLICATIONS

A. Asenov et al., "Supression of Random Dopant-Induced Threshold Voltage Fluctuations in Sub-0.1-μm MOSFET's with Epitaxial and δ-doped Channels", IEEE Transactions on Electron Devices, vol. 46, No. 8, 1999, pp. 1718-1724.

(Continued)

*Primary Examiner* — Tan N Tran
(74) *Attorney, Agent, or Firm* — Westerman, Hattori, Daniels & Adrian, LLP

(57) ABSTRACT

The semiconductor device includes a first transistor including a first impurity layer containing boron or phosphorus, a first epitaxial layer formed above the first impurity layer, a first gate electrode formed above the first epitaxial layer with a first gate insulating film formed therebetween and first source/drain regions, and a second transistor including a second impurity layer containing boron and carbon, or arsenic or antimony, a second epitaxial layer formed above the second impurity layer, a second gate electrode formed above the second epitaxial layer with a second gate insulating film thinner than the first gate insulating film formed therebetween, and second source/drain regions.

9 Claims, 32 Drawing Sheets

(51) Int. Cl.
  *H01L 21/761* (2006.01)
  *H01L 27/092* (2006.01)
  *H01L 29/10* (2006.01)
  *H01L 21/265* (2006.01)
  *H01L 29/66* (2006.01)
  *H01L 29/78* (2006.01)

(52) U.S. Cl.
  CPC *H01L21/823878* (2013.01); *H01L 21/823892* (2013.01); *H01L 27/0928* (2013.01); *H01L 29/1083* (2013.01); *H01L 21/26506* (2013.01); *H01L 29/665* (2013.01); *H01L 29/6659* (2013.01); *H01L 29/7833* (2013.01)

(56) References Cited

U.S. PATENT DOCUMENTS

| | | | |
|---|---|---|---|
| 2006/0220114 A1 | 10/2006 | Miyashita et al. | |
| 2006/0240627 A1 | 10/2006 | Inoue | |
| 2007/0032027 A1* | 2/2007 | Shin et al. | 438/302 |
| 2007/0187797 A1* | 8/2007 | Kato et al. | 257/500 |
| 2009/0108350 A1 | 4/2009 | Cai et al. | |
| 2009/0253235 A1 | 10/2009 | Ota et al. | |

OTHER PUBLICATIONS

A. Hokazono et al., "Steep Channel Profiles in n/pMOS Controlled by Boron-doped Si:C Layers for Continual Bulk-CMOS Scaling", IEEE, 2009, pp. IEDM09-673-IEDM09-676.

Woo-Hyeong Lee, "MOS Device Structure Development for ULSI: Low Power/High Speed Operation", Microelectron. Reliab., vol. 37, No. 9, 1997, pp. 1309-1314.

Japanese Office Action dated Feb. 18, 2014, issued in Japanese Patent Application No. 2010-220774, w/English translation (7 pages).

* cited by examiner

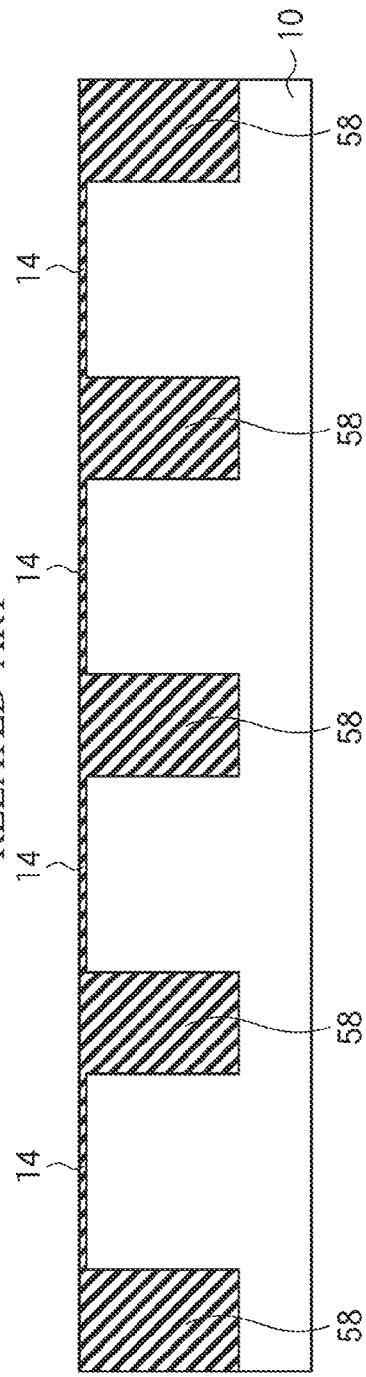
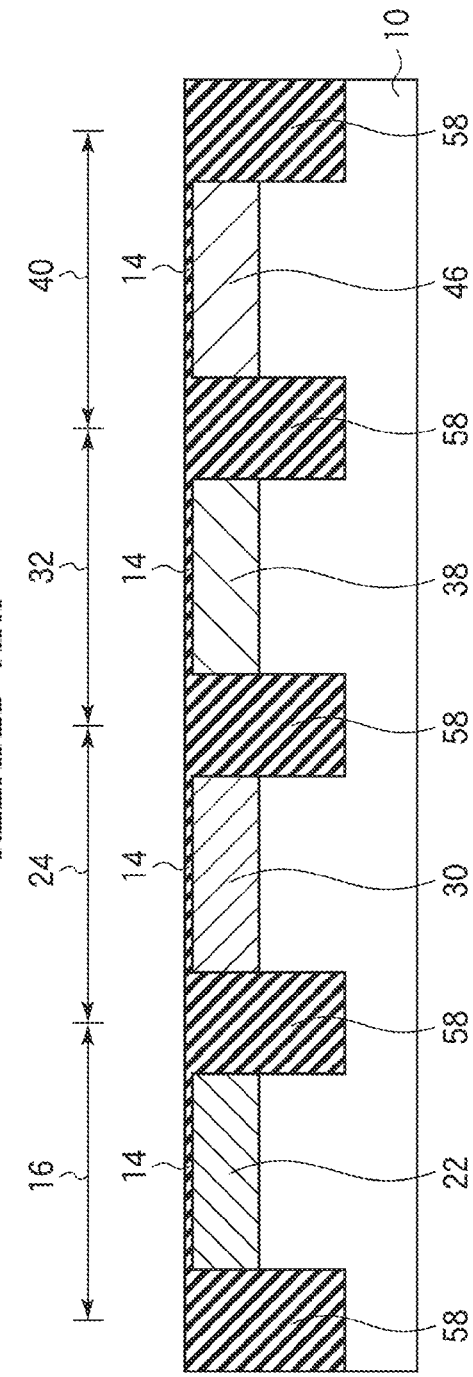

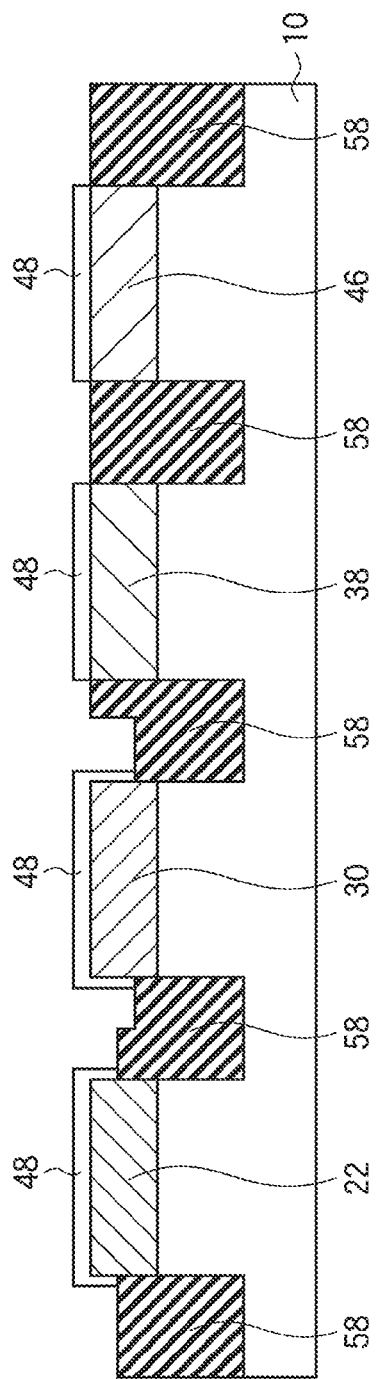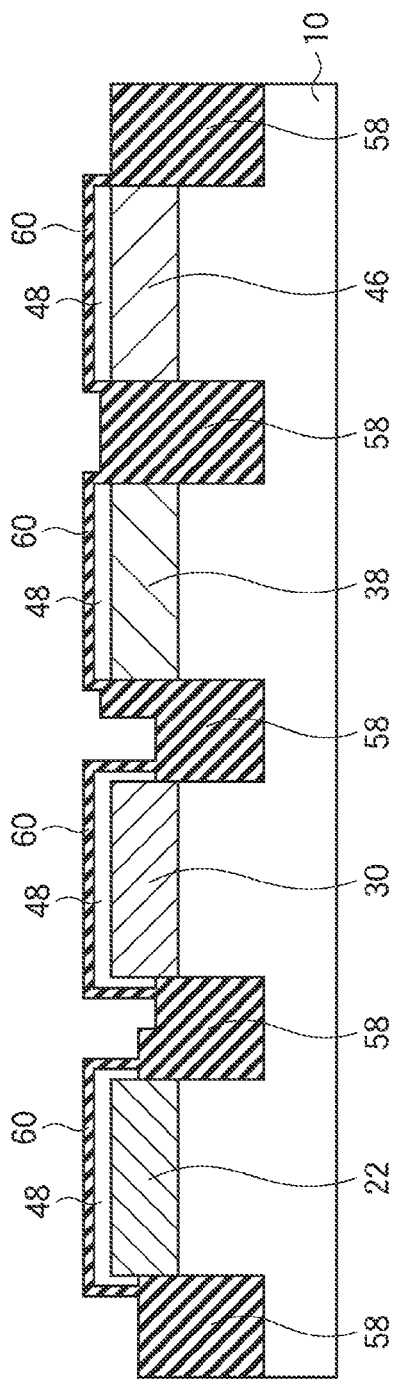

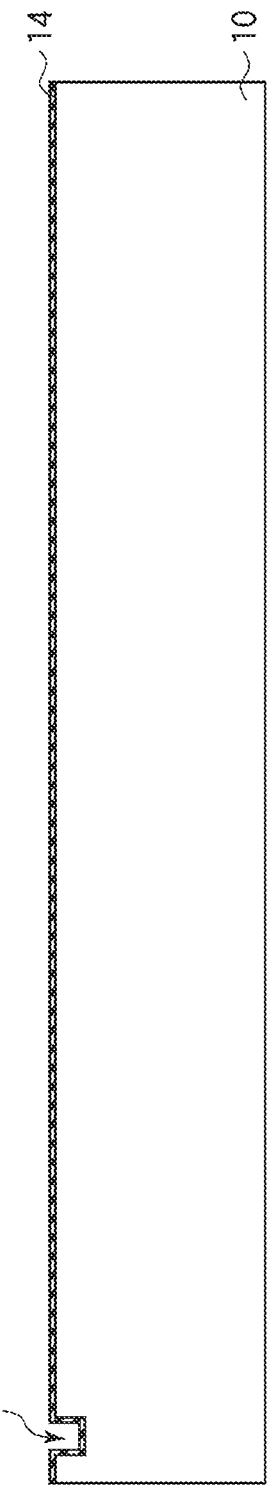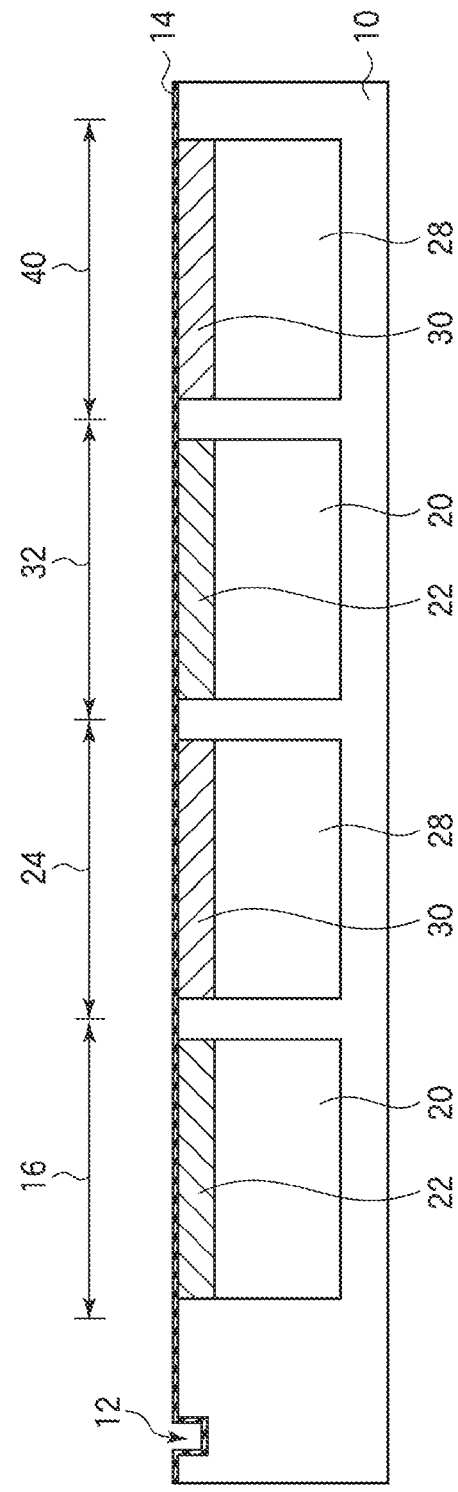

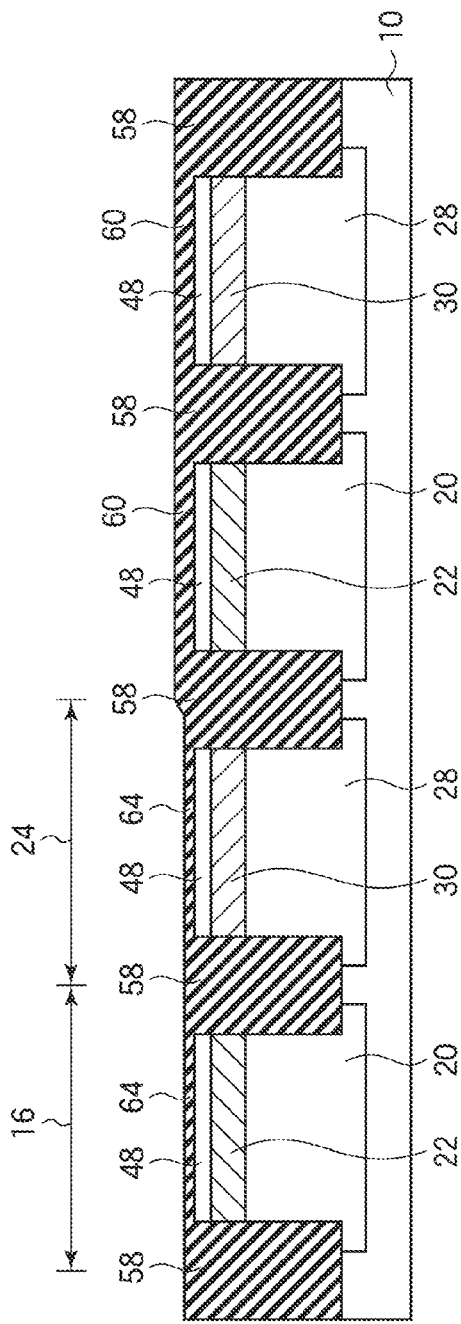
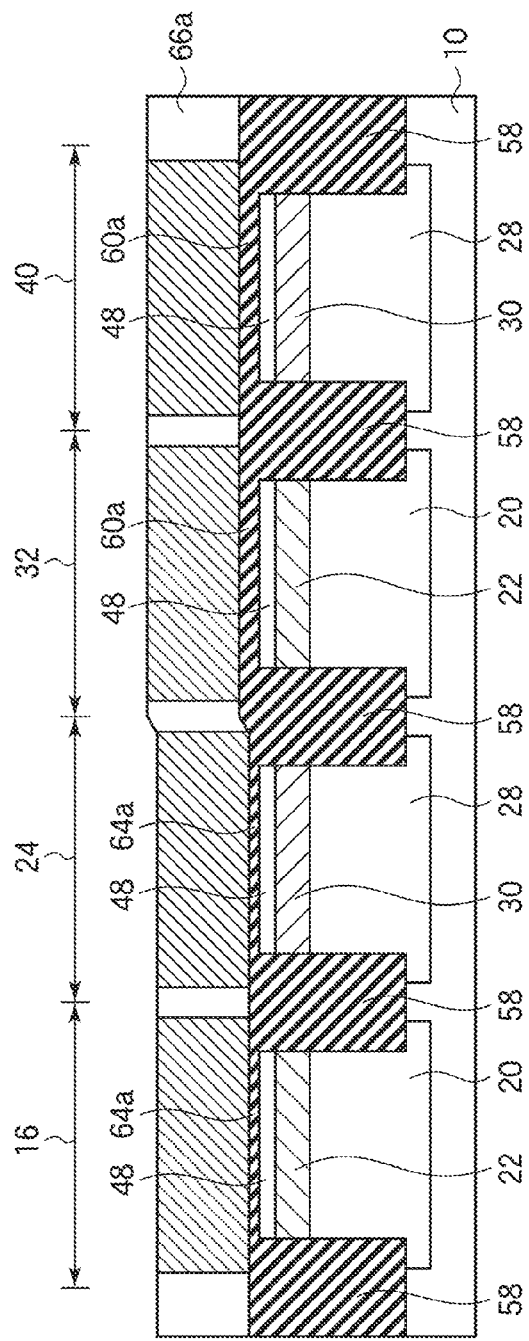
FIG. 30A RELATED ART
FIG. 30B RELATED ART

SEMICONDUCTOR DEVICE AND METHOD OF MANUFACTURING SEMICONDUCTOR DEVICE

CROSS REFERENCE TO RELATED APPLICATIONS

This application is a divisional application of U.S. application Ser. No. 13/625,176, filed Sep. 24, 2012, which is a divisional application of U.S. application Ser. No. 13/172,224, filed Jun. 29, 2011, and is based upon and claims the benefit of priority of the prior Japanese Patent Application No. 2010-220774, filed on Sep. 30, 2010, the entire contents of which are incorporated herein by reference.

FIELD

The embodiments discussed herein are related to a semiconductor device and a method of manufacturing a semiconductor device.

BACKGROUND

As semiconductor devices are downsized and highly integrated, the fluctuations of the threshold voltages of the transistors due to statistical fluctuations of the channel impurity becomes conspicuous. The threshold voltage is one of important parameters for deciding the performance of the transistors, and to manufacture semiconductor device of high performance and high reliability, it is important to decrease the fluctuations of the threshold voltage due to the statistical fluctuations of the impurity.

As one technique of decreasing the fluctuations of the threshold voltage due to the statistical fluctuations is proposed the technique that a non-doped epitaxial silicon layer is formed on a highly doped channel impurity layer having a steep impurity concentration distribution.

The following are examples of related: U.S. Pat. No. 6,482,714; U.S. Patent Publication No. 2009/0108350; A. Asenov, "Suppression of Random Dopant-Induced Threshold Voltage Fluctuations in Sub-0.1-µm MOSFET's with Epitaxial and δ-doped Channels", IEEE Transactions on Electron Devices, vol. 46, No. 8. p. 1718, 1999; Woo-Hyeong Lee, "MOS Device Structure Development for ULSI: Low Power/High Speed Operation", Microelectron. Reliab., Vol. 37, No. 9, pp. 1309-1314, 1997; and A. Hokazono et al., "Steep Channel Profiles in n/pMOS Controlled by Boron-Doped Si:C Layers for Continual Bulk-CMOS Scaling", IEDM09-673.

No method for incorporating the proposed techniques described above in the semiconductor device manufacturing processes have been specifically proposed. For example, new problems arising when the proposed techniques described above are applied to the method of manufacturing semiconductor devices including a low voltage transistor and a high voltage transistor, and their solving means have not been specifically discussed.

SUMMARY

According to one aspect of an embodiment, there is provided a method of manufacturing a semiconductor device including ion implanting a first impurity of a first conduction type in a first region of a semiconductor substrate by using a first mask exposing the first region, ion implanting, in a second region of the semiconductor substrate by using a second mask exposing the second region, a second impurity of the first conduction type, whose diffusion constant is smaller than the first impurity or the first impurity and a third impurity which suppresses a diffusion of the first impurity, activating the first impurity and the second impurity to form a first impurity layer in the first region and a second impurity layer in the second region, epitaxially growing a semiconductor layer above the semiconductor substrate with the first impurity layer and the second impurity layer formed in, forming a first gate insulating film above the semiconductor layer in the first region and the second region, removing the first gate insulating film in the second region by using a third mask exposing the second region, forming a second gate insulating film thinner than the first gate insulating film above the semiconductor layer in the second region, and forming a first gate electrode above the first gate insulating film and a second gate electrode above the second gate insulating film.

According to another aspect of an embodiment, there is provided a method of manufacturing a semiconductor device including ion implanting a first impurity in a first region of a semiconductor substrate by using a first mask exposing the first region, ion implanting a second impurity of the same conduction type as the first impurity in a second region of the semiconductor substrate by using a second mask exposing the second region, ion implanting a third impurity of a conduction type opposite to the first impurity in a third region of the semiconductor substrate by using a third mask exposing the third region, ion implanting a fourth impurity of a conduction type opposite to the first impurity in a fourth region of the semiconductor substrate by using a fourth mask exposing the fourth region, activating the first impurity, the second impurity, the third impurity and the fourth impurity to form a first impurity layer in the first region, a second impurity layer in the second region, a third impurity layer in the third region and a fourth impurity layer in the fourth region, epitaxially growing a semiconductor layer above the semiconductor substrate with the first impurity layer, the second impurity layer, the third impurity layer and the fourth impurity layer formed in, forming a first gate insulating film above the semiconductor layer in the first region, the second region, the third region and the fourth region, removing the first gate insulating film in the second region and the fourth region by using a fifth mask exposing the second region and the fourth region, forming a second gate insulating film thinner than the first gate insulating film above the semiconductor layer in the second region and the fourth region, forming a first gate electrode above the first gate insulating film in the first region, a second gate electrode above the second gate insulating film in the second region, a third gate electrode above the first gate insulating film in the third region and the fourth gate electrode above the second gate insulating film in the fourth region.

According to further another aspect of an embodiment, there is provided a semiconductor device including a first transistor including a first impurity layer formed in a first region of a semiconductor substrate and containing boron, a first epitaxial semiconductor layer formed above the first impurity layer, a first gate insulating film formed above the first epitaxial semiconductor layer, a first gate electrode formed above the first gate insulation film, and first source/drain regions formed in the first epitaxial semiconductor layer and the semiconductor substrate in the first region, a second transistor including a second impurity layer formed in a second region of the semiconductor substrate and containing boron and carbon, a second epitaxial semiconductor layer formed above the second impurity layer, a second gate insulating film formed above the second epitaxial semiconductor layer and being thinner than the first gate insulating film, a second gate electrode formed above the second gate insulating film, and second source/drain regions formed in the second epitaxial semiconductor layer and the semiconductor substrate in the second region, a third transistor including a third impurity layer formed in a third region of the semiconductor substrate and containing phosphorus, a third epitaxial semiconductor layer formed above the third impurity layer, a third gate insulating film formed above the third epitaxial semiconductor layer and having a film thickness equal to a film thickness of the first gate insulating film, a third gate electrode formed above the third gate insulating film, and third source/drain regions formed in the third epitaxial semiconductor layer and the semiconductor substrate in the third region, and a fourth transistor including a fourth impurity layer formed in a fourth region of the semiconductor substrate and containing arsenic or antimony, a fourth epitaxial semiconductor layer formed above the fourth impurity layer, a fourth gate insulating film formed above the fourth epitaxial semiconductor layer and having a film thickness equal to a film thickness of the second gate insulating film, a fourth gate electrode formed above the fourth gate insulating film, and fourth source/drain regions formed in the fourth epitaxial semiconductor layer and the semiconductor substrate in the fourth region.

The object and advantages of the embodiment will be realized and attained by means of the elements and combinations particularly pointed out in the claims.

It is to be understood that both the foregoing general description and the following detailed description are exemplary and explanatory and are not restrictive of the embodiments, as claimed.

BRIEF DESCRIPTION OF DRAWINGS

FIGS. 24A-24B, 25A-25B and 26A-26B are sectional views illustrating a method of manufacturing a semiconductor device according to a first reference example; and FIGS. 27A-27B, 28A-28B, 29A-29B, 30A-30B, 31A-31B and 32 are sectional views illustrating a method of manufacturing a semiconductor device according to a second reference example.

DESCRIPTION OF EMBODIMENTS

A First Embodiment

A semiconductor device and a method of manufacturing a semiconductor device according to a first embodiment will be described with reference to FIGS. 1 to 19.

Figure 1:
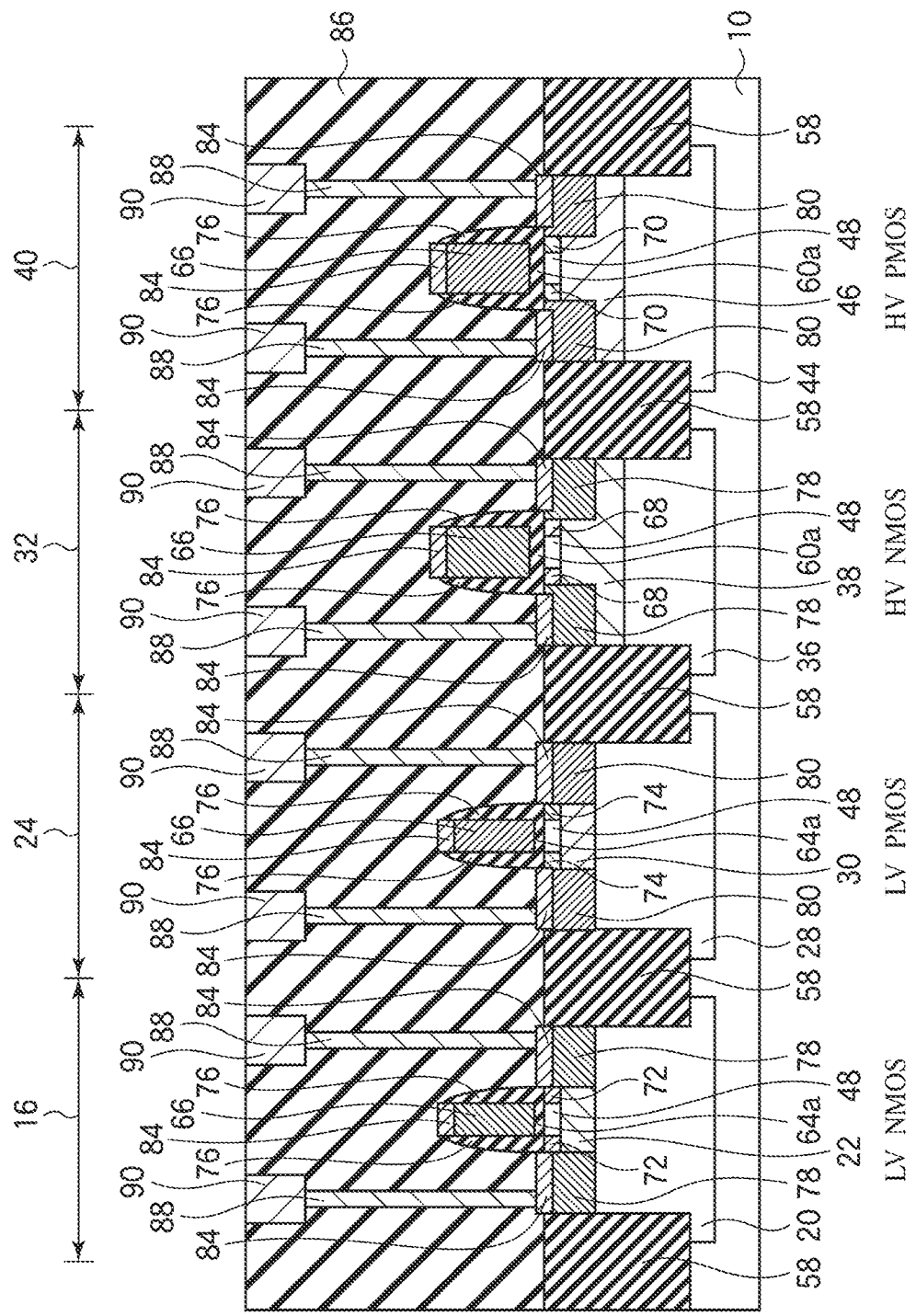
FIGS. 1 and 2 are diagrammatic sectional views illustrating a structure of a semiconductor device according to a first embodiment.
Figure 2:
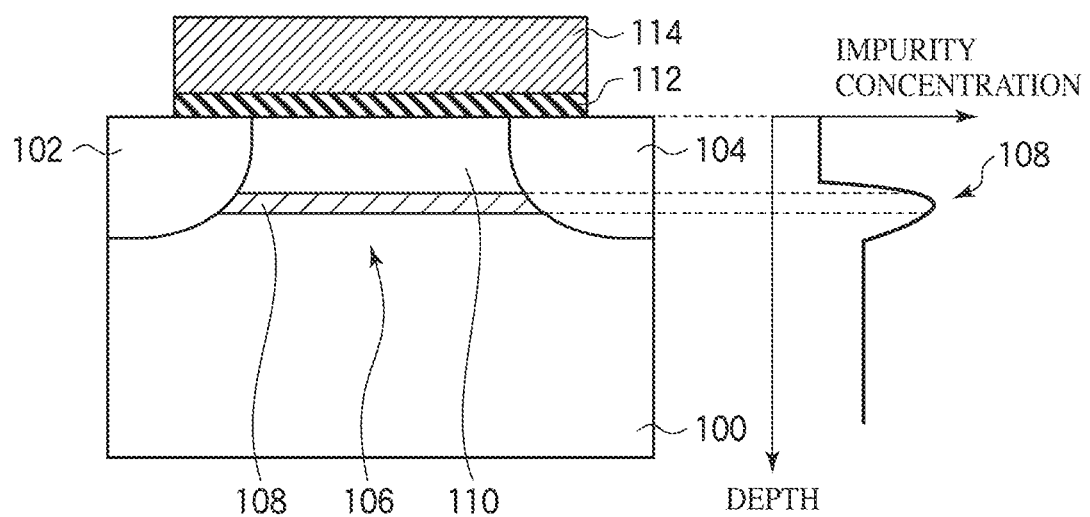

FIGS. 1 and 2 are diagrammatic sectional views illustrating a structure of the semiconductor device according to the present embodiment. FIGS. 3-19 are sectional views illustrating a method of manufacturing the semiconductor device according to the present embodiment.

First, the structure of the semiconductor device according to the present embodiment will be described with reference to FIGS. 1 and 2.

Above a silicon substrate 10, a low-voltage NMOS transistor (LV NMOS) and a low-voltage PMOS transistor (LV PMOS), a high-voltage NMOS transistor (HV NMOS) and a high-voltage PMOS transistor (HV PMOS) are formed. The low voltage transistors are used mainly in the circuit units which require high-speed operation. The high voltage transistors are used in circuit units, such as a 3.3 V I/O, etc., high voltages are applied to.

The low-voltage NMOS transistor (LV NMOS) is formed in a low-voltage NMOS transistor forming region 16 of the silicon substrate 10.

In the silicon substrate 10 in the low-voltage NMOS transistor forming region 16, a p-well 20 and a p-type highly doped impurity layer 22 are formed. Above the p-type highly doped impurity layer 22, a silicon layer 48 epitaxially grown on the silicon substrate 10 is formed. Above the silicon layer 48, a gate insulating film 64a is formed. Above the gate insulating film 64a, a gate electrode 66 is formed. In the silicon layer 48 and the silicon substrate 10 on both sides of a gate electrode 66, source/drain regions 78 are formed. Thus, the low-voltage NMOS transistor (LV NMOS) is formed.

The low-voltage PMOS (LV PMOS) is formed in the low-voltage PMOS transistor forming region 24 of the silicon substrate 10.

In the silicon substrate 10 in the low-voltage PMOS transistor forming region 24, an n-well 28 and an n-type highly doped impurity layer 30 are formed. Above the n-type highly doped impurity layer 30, a silicon layer 48 epitaxially grown on the silicon substrate 10 is formed. Above the silicon layer 48, a gate insulating film 64a is formed. Above the gate insulating film 64a, a gate electrode 66 is formed. In the silicon layer 48 and the silicon substrate 10 on both sides of the gate electrode 66, source/drain regions 80 are formed. Thus, the low-voltage PMOS transistor (LV PMOS) is formed.

The high voltage NMOS transistor (HV NMOS) is formed in a high voltage NMOS transistor forming region 32 of the silicon substrate 10.

In the silicon substrate 10 in the high voltage NMOS transistor forming region 32, a p-well 36 and a p-type impurity layer 38 are formed. To improve the junction breakdown voltage, the p-type impurity layer 38 has a lower concentration and a gradual impurity distribution than the p-type highly doped impurity layer 22 of the low voltage NMOS transistor. Above the p-type impurity layer 38, a silicon layer 48 epitaxially grown on the silicon substrate 10 is formed. Above the silicon layer 48, a gate insulating film 60a thicker than the gate insulating films 64a of the low voltage transistors is formed. Above the gate insulating film 60a, a gate electrode 66 is formed. In the silicon layer 48 and the silicon substrate 10 on both sides of the gate electrode 66, source/drain regions 78 are formed. Thus, the high voltage NMOS transistor (HV NMOS) is formed.

A high voltage PMOS transistor (HV PMOS) is formed in a high voltage PMOS transistor forming region 40 of the silicon substrate 10.

In the silicon substrate 10 in the high voltage PMOS transistor forming region 40, an n-well 44 and an n-type impurity layer 46 are formed. To improve the junction breakdown voltage, the n-type impurity layer 46 has a lower concentration and a gradual impurity distribution than the n-type highly doped impurity layer 30 of the low voltage PMOS transistor. Above the n-type impurity layer 46, a silicon layer 48 epitaxially grown on the silicon substrate 10 is formed. Above the silicon layer 48, a gate insulating film 60a thicker than the gate insulating films 64a of the low voltage transistors is formed. Above the gate insulating film 60a, a gate electrode 66 is formed. In the silicon layer 48 and the silicon substrate 10 on both sides of the gate electrode 66, source/drain regions 80 are formed. Thus, the high voltage PMOS transistor (HV PMOS) is formed.

Above the gate electrodes 66 and the source/drain regions 78, 80 of the respective transistors, a metal silicide film 84 is formed.

Above the silicon substrate 10 with the transistors of the four kinds formed on, an inter-layer insulating film 86 is formed. In the inter-layer insulating film 86, contact plugs 88 connected to the transistors are buried. To the contact plugs 88, interconnections 90 are connected.

As described above, the semiconductor device according to the present embodiment includes two kinds of low voltage transistors and two kinds of high voltage transistors.

As exemplified in FIG. 2, the low voltage transistors each include in the channel region 106, a highly doped impurity layer 108 having a steep impurity concentration distribution, and a non-doped silicon layer 110 epitaxially grown on the highly doped impurity layer 108. Such transistor structure is effective to suppress the threshold voltage fluctuations of the transistors due to the statistical fluctuations of the impurity. To suppress the fluctuations of the threshold voltage, it is important that the impurity concentration distribution of the highly doped impurity layer 108 is steep.

To realize the steep impurity concentration distribution, in the highly doped impurity layer 22 of the low voltage NMOS transistor, boron as the acceptor impurity, and carbon for preventing the diffusion of the boron are implanted. In the highly doped impurity layer 30 of the low voltage PMOS transistor, arsenic or antimony, whose diffusion constant is low, is implanted as the donor impurity.

On the other hand, when the impurity layer 46 of the high voltage NMOS transistor and the impurity layer 46 of the high voltage PMOS transistor are highly doped and have steep impurity distributions, the junction breakdown voltage and the hot carrier immunity are lowered. Accordingly, in the impurity layer 38 of the high voltage NMOS transistor, boron is implanted as the acceptor impurity, but carbon, which has the diffusion preventing function, is not implanted. In the impurity layer 46 of the high voltage PMOS transistor, phosphorus, whose diffusion constant is larger than arsenic and antimony, is implanted. Thus, the impurity layer 38 and the impurity layer 46 have lower concentrations and gradual impurity concentration distributions in comparison with the p-type highly doped impurity layer 22 and the n-type highly doped impurity layer 30.

Next, the method of manufacturing the semiconductor device according to the present embodiment will be described with reference to FIGS. 3 to 19.

First, by photolithography and etching, a trench 12 to be used as the mark for the mask alignment is formed in a region other than the product to be formed region of the silicon substrate 10 (e.g., a scribe region).

In the method of manufacturing the semiconductor device according to the present embodiment, before device isolation insulating film 58 is formed, the wells and the channel impurity layers are formed. The trench 12 is used as the mark for the mask alignment in the lithography process made before the device isolation insulating film 58 is formed (e.g., the lithography process for forming the wells and the channel impurity layers).

The wells and the channel impurity layers are formed before the device isolation insulating films 58 are formed so as to suppress the film thickness decrease of the device isolation insulating film 58 in removing the silicon oxide films 14, 52, 60 (refer to a first reference example described later).

Figure 3:
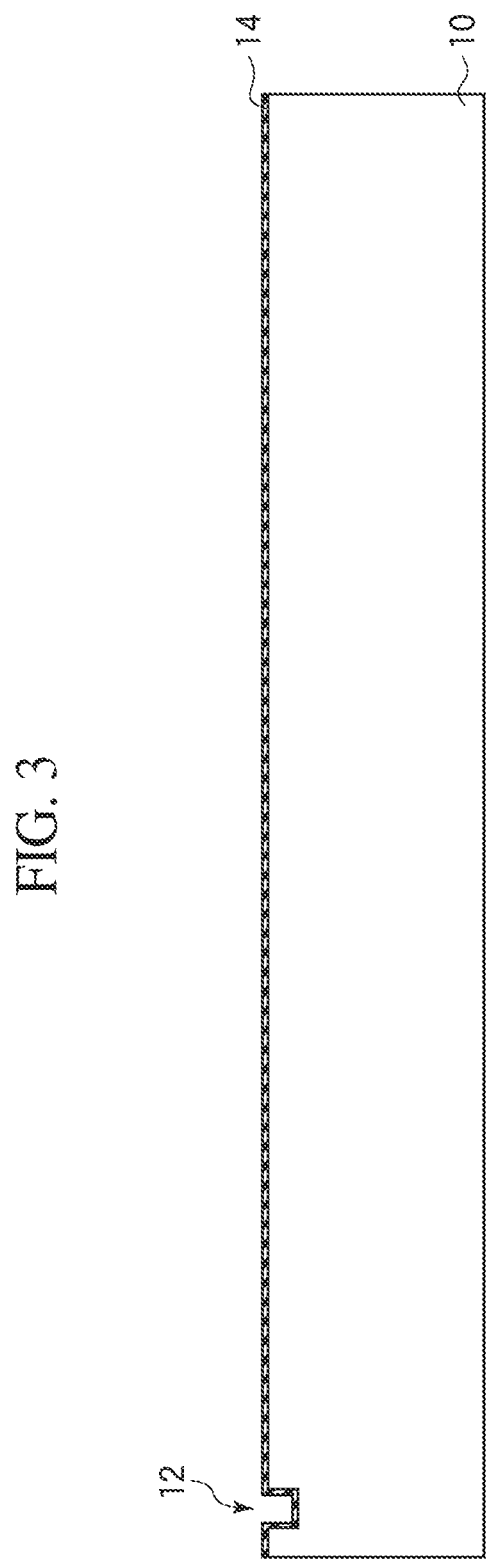
FIGS. 3-19 are sectional views illustrating a method of manufacturing the semiconductor device according to the first embodiment.

Next, above the entire surface of the silicon substrate 10, a silicon oxide film 14 as the protection film of the surface of the silicon substrate 10 is formed by, e.g., thermal oxidation method (FIG. 3).

Next, by photolithography, a photoresist film 18 exposing the low voltage NMOS transistor forming region 16 and covering the rest region is formed. For the alignment for the photolithography, the trench 12 is used as the alignment mark.

Figure 4:
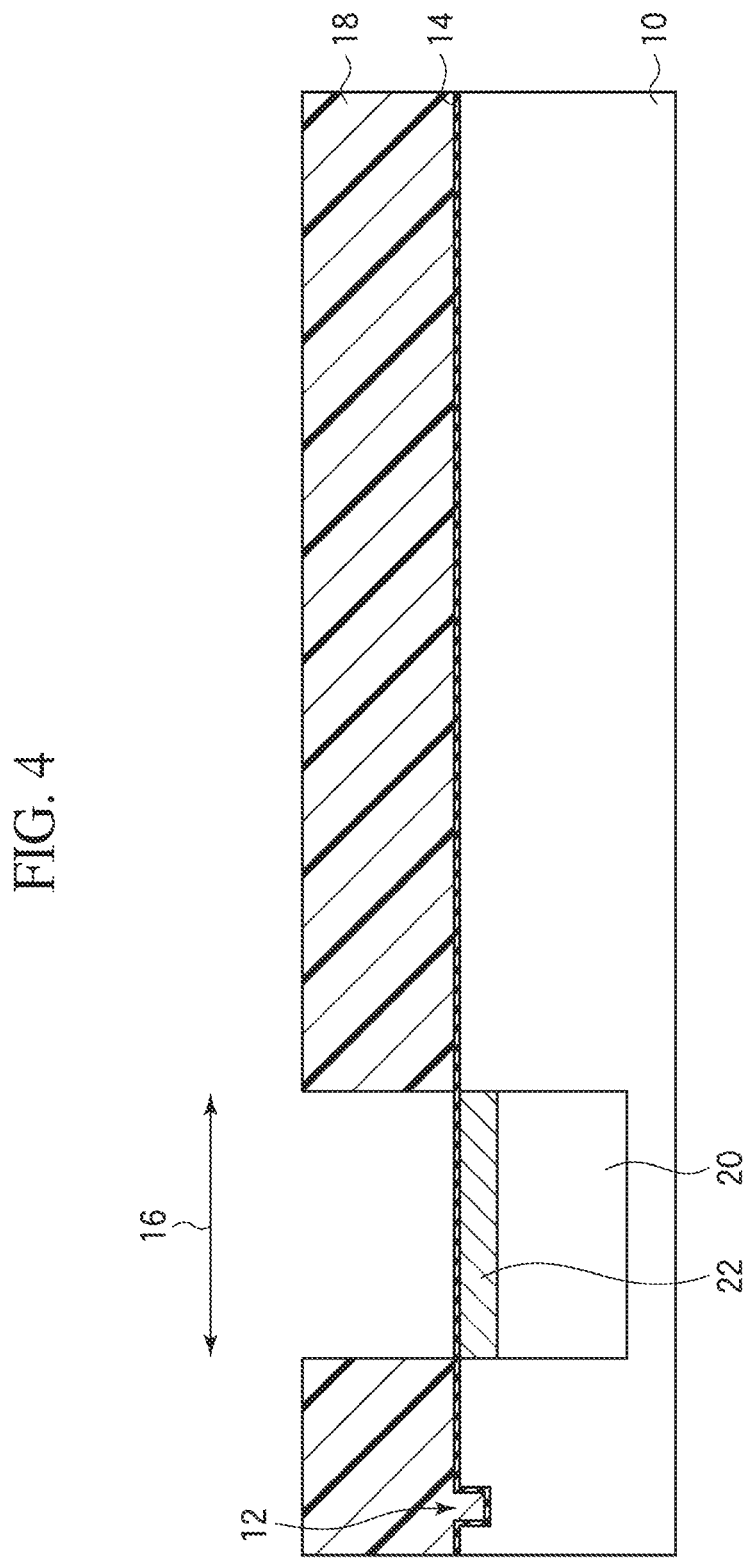

Next, ion implantation is made with the photoresist film 18 as the mask to form a p-well 20 and a p-type highly doped impurity layer 22 in the low voltage NMOS transistor forming region 16 (FIG. 4).

The p-well 20 is formed, e.g., by implanting boron ions ($B^+$) respectively in 4 directions tilted to the normal direction of the substrate under the conditions of 150 keV acceleration energy and $7.5 \times 10^{12}$ $cm^{-2}$ dose. The p-type highly doped impurity layer 22 is formed, e.g., by respectively implanting germanium ions ($Ge^+$) under the conditions of 50 keV acceleration energy and $5 \times 10^{14}$ $cm^{-2}$, carbon ions ($C^+$) under the conditions of 3 keV acceleration energy and $3 \times 10^{14}$ $cm^{-2}$ and boron ions ($B^+$) under the conditions of 2 keV acceleration energy and $3 \times 10^{13}$ $cm^{-2}$. Germanium acts to amorphize the silicon substrate 10 to thereby prevent the channeling of the boron ions and amorphize the silicon substrate 10 to increase the probability of positioning the carbon at the lattice points. The carbon positioned at the lattice points acts to suppress the diffusion of boron. In view of this, it is preferable to ion implant germanium before carbon and boron, and the p-well 20 is formed before the p-type highly doped impurity layers 22.

Next, by, e.g., ashing method, the photoresist film 18 is removed.

Then, by photolithography, a photoresist film 26 exposing the low voltage PMOS transistor forming region 24 and covering the rest region is formed. For the alignment for the photolithography, the trench 12 is used as the alignment mark.

Figure 5:
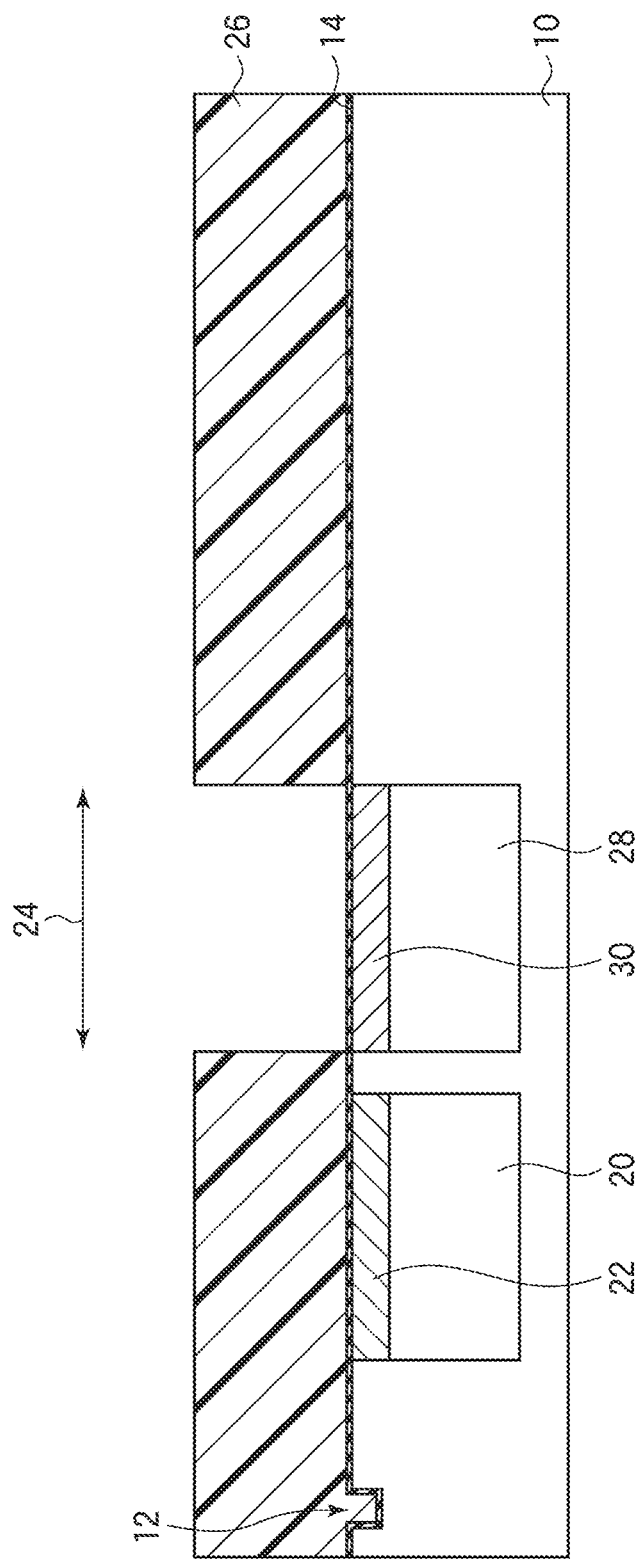

Next, with the photoresist film 26 as the mask, ion implantation is made to form an n-well 28 and an n-type highly doped impurity layer 30 are formed in the low voltage PMOS transistor forming region 24 of the silicon substrate 10 (FIG. 5).

The n-well 28 is formed, e.g., by implanting respectively in 4 directions tilted to the normal direction of the substrate phosphorus ions ($P^+$) under the conditions of 360 keV acceleration energy and $7.5 \times 10^{12}$ $cm^{-2}$ dose and arsenic ions ($As^+$) under the conditions of 80 keV acceleration energy and $6 \times 10^{12}$ $cm^{-2}$ dose. The n-type highly doped impurity layer 30 is formed, e.g., by implanting arsenic ions under the conditions of 6 keV acceleration energy and $2 \times 10^{13}$ $cm^{-2}$ dose, or antimony ions ($Sb^+$) under the conditions of 20 keV-50 keV acceleration energy (e.g., 20 keV) and $0.5 \times 10^{13}$ $cm^{-2}$-$2.0 \times 10^{13}$ $cm^{-2}$ dose (e.g., $1.5 \times 10^{13}$ $cm^{-2}$). Preferably, the n-well 28 is formed before the n-type highly doped impurity layer 30.

Next, by, e.g., ashing method, the photoresist film 26 is removed.

Then, by photolithography, a photoresist film 34 exposing the high voltage NMOS transistor forming region 32 and covering the rest region is formed. For the alignment for the photolithography, the trench 12 is used as the alignment mark.

Figure 6:
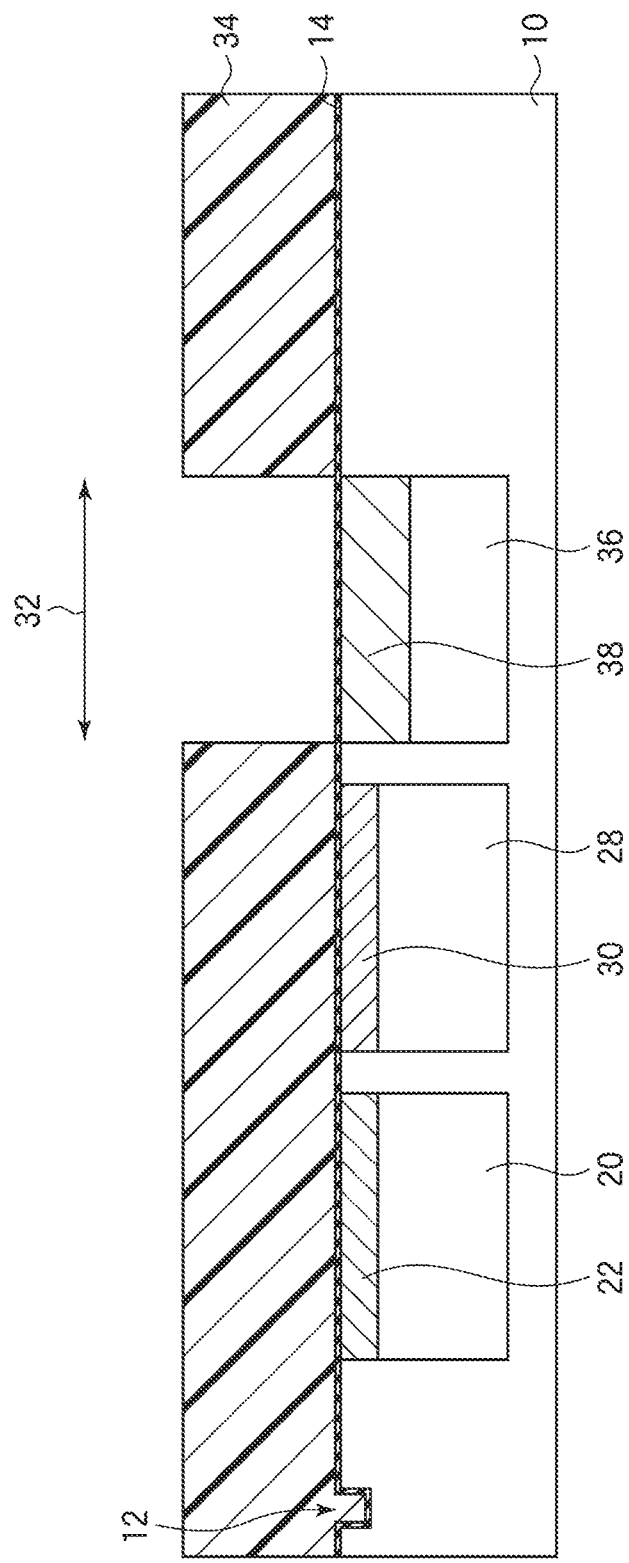

Next, with the photoresist film 34 as the mask, ion implantation is made to form a p-well 36 and a p-type impurity layer 38 in the high voltage NMOS transistor forming region 32 of the silicon substrate 10 (FIG. 6).

The p-well 36 is formed, e.g., by implanting respectively in 4 directions tilted to the normal direction of the substrate boron ions under the conditions of 150 keV acceleration energy and $7.5 \times 10^{12}$ cm$^{-2}$ dose. The p-type impurity layer 38 is formed, e.g., by implanting boron ions under the conditions of 2 keV acceleration energy and $5 \times 10^{12}$ cm$^{-2}$ dose. In the high voltage NMOS transistor, in view of making the impurity concentration distribution of the channel region gradual to thereby improve the junction breakdown voltage and the hot carrier immunity, neither carbon nor germanium is ion implanted.

Next, by, e.g., asking method, the photoresist film 34 is removed.

Next, by photolithography, a photoresist film 42 exposing the high voltage PMOS transistor forming region 40 and covering the reset region is formed. For the alignment for the photolithography, the trench 12 is used as the alignment mark.

Figure 7:
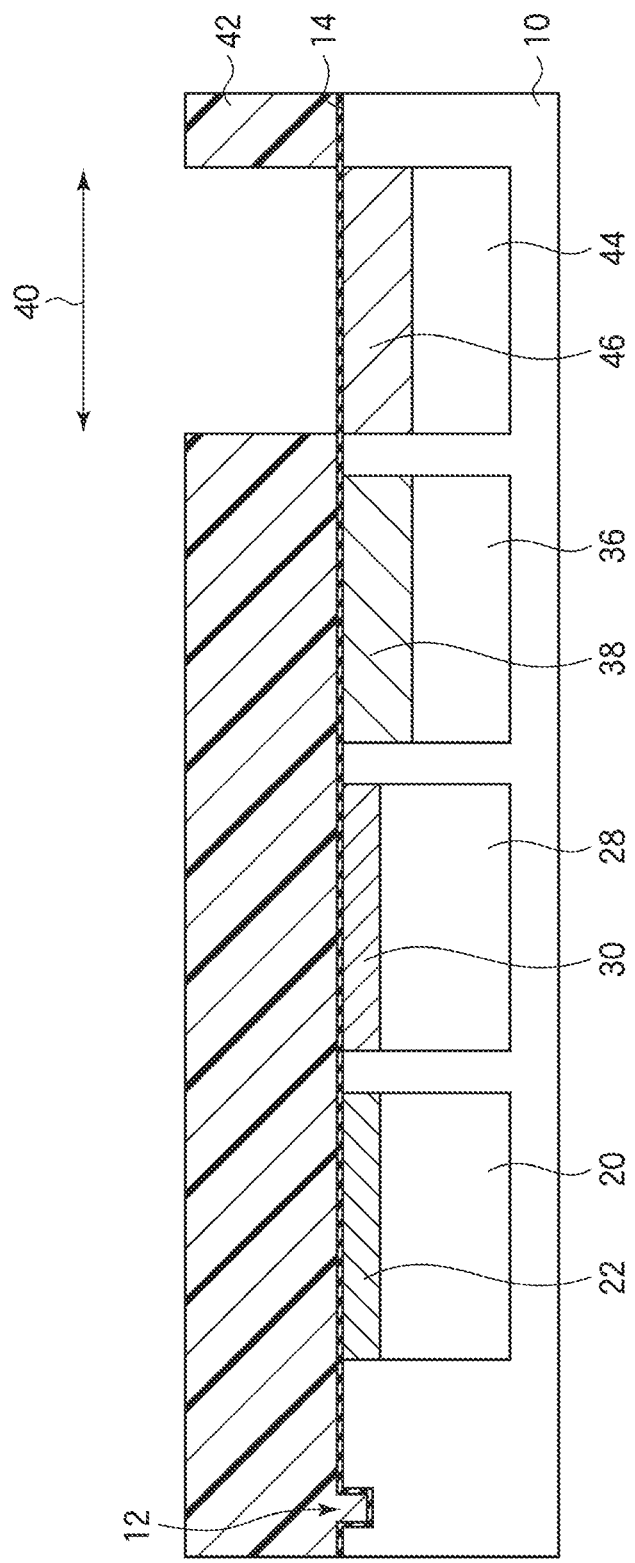

Next, with the photoresist film 42 as the mask, ion implantation is made to form an n-well 44 and an n-type impurity layer 46 in the high voltage PMOS transistor forming region 40 of the silicon substrate 10 (FIG. 7).

The n-well 44 is formed, e.g., by implanting respectively in 4 directions tilted to the normal direction of the substrate phosphorus ions at 360 keV acceleration energy and $7.5 \times 10^{12}$ cm$^{-2}$ dose. The n-type impurity layer 46 is formed, e.g., by implanting phosphorus ions at 2 keV acceleration energy and $5 \times 10^{12}$ cm$^{-2}$ dose. In the high voltage PMOS transistor, in view of making the impurity concentration distribution of the channel region gradual to thereby improve the junction breakdown voltage and hot carrier immunity, phosphorus in place of arsenic or antimony is ion implanted.

Next, by, e.g., asking method, the photoresist film 42 is removed.

Next, thermal processing is made in an inert ambient atmosphere to recover ion implantation damages introduced in the silicon substrate 10 while activating the implanted impurities. For example, the thermal processing is made in nitrogen ambient atmosphere on two stages of 600° C. and 150 seconds and 1000° C. and 0 second.

Then, by wet etching with, e.g., hydrofluoric acid aqueous solution, the silicon oxide film 14 is removed. At this time the device isolation insulating film 58 has not been formed on the silicon substrate, and the film thickness decrease of the device isolation insulating film 58 due to the etching of the silicon oxide film 14 does not take place.

Figure 8:
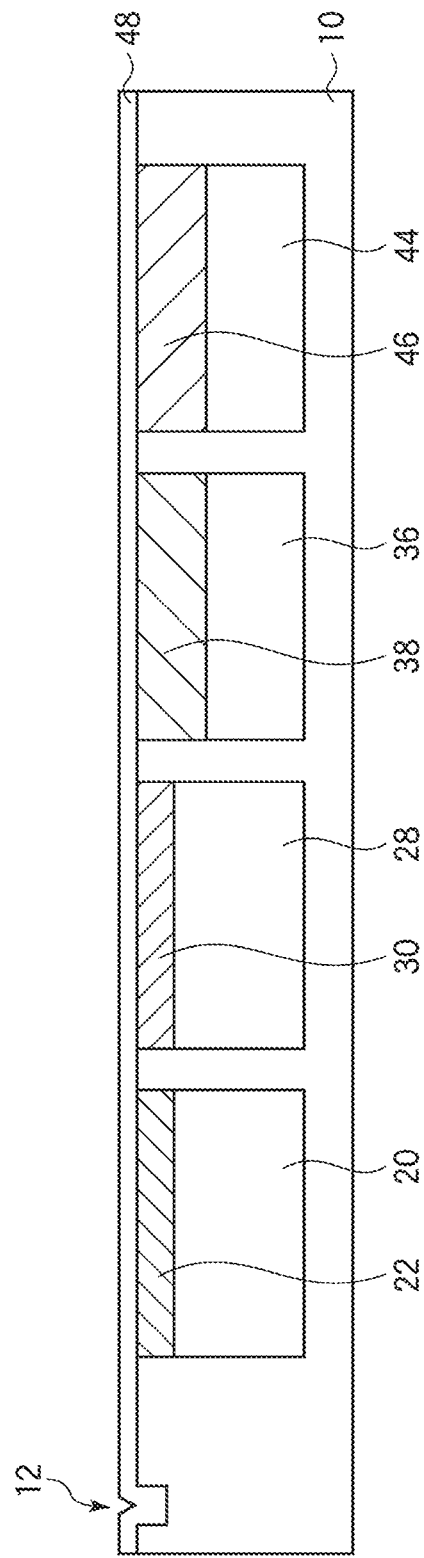

Next, by, e.g., CVD method, a non-doped silicon layer 48 of, e.g., a 30 nm-thickness is grown on the surface of the silicon substrate 10 (FIG. 8).

Next, by, e.g., ISSG (In-Situ Steam Generation) method, the surface of the silicon layer 48 is wet oxidized under a reduced pressure to form a silicon oxide film 52 of, e.g., a 3 nm-thickness. As the processing conditions, for example, the temperature is set at 810° C., and the processing period of time is set at 20 seconds.

Then, above the silicon oxide film 52, a silicon nitride film 54 of, e.g., a 70 nm-thickness is deposited by, e.g., LPCVD method. As the processing conditions, for example, the temperature is set at 700° C., and the processing period of time is set at 150 minutes.

Figure 9:
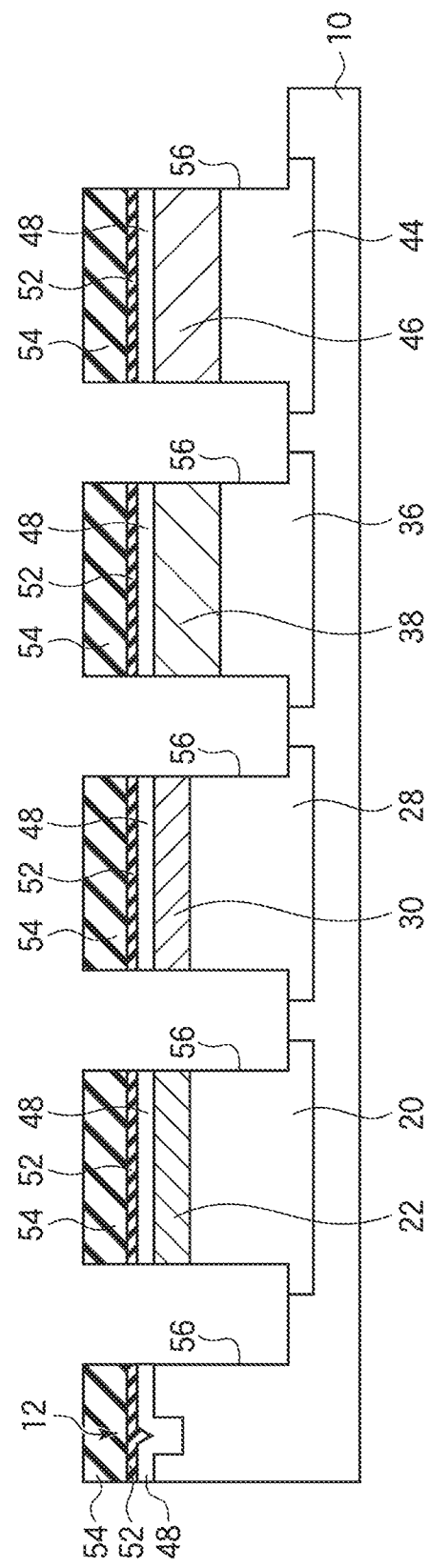

Next, by photolithography and dry etching, the silicon nitride film 54, the silicon oxide film 52, the silicon layer 48 and the silicon substrate 10 are anisotropically etched to form a device isolation trench 56 in the device isolation region containing the regions between the respective transistor forming regions (FIG. 9). For the alignment for the photolithography, the trench 12 is used as the alignment mark.

Next, by, e.g., ISSG method, the surface of the silicon layer 48 and the silicon substrate 10 are wet oxidized under a decreased pressure to form a silicon oxide film of, e.g., a 2 nm-thickness as the liner film on the inside walls of the device isolation trench 56. As the processing conditions, for example, the temperature is set at 810° C., and the processing period of time is set at 12 seconds.

Next, by, e.g., high density plasma CVD method, a silicon oxide film of, e.g., a 500 nm-thickness is deposited to fill the device isolation trench 56 by the silicon oxide film.

Figure 10:
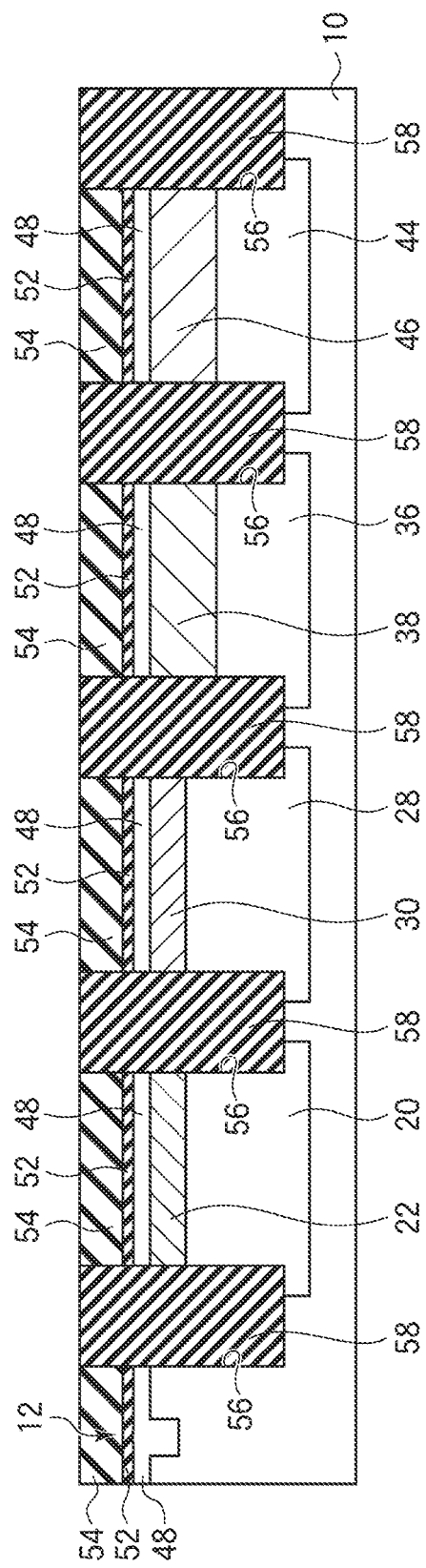

Then, by, e.g., CMP method, the silicon oxide film above the silicon nitride film 54 is removed. Thus, by the so-called STI (Shallow Trench Isolation) method, the device isolation insulating film 58 of the silicon oxide film buried in the device isolation trench 56 is formed (FIG. 10).

Next, by, e.g., wet etching with hydrofluoric acid aqueous solution and with the silicon nitride film 54 as the mask, the device isolation insulating film 58 is etched by, e.g., about 30 nm. This etching is for adjusting the surface of the silicon layer 48 of the completed transistors and the surface of the device isolation insulating film 58 to be on the substantially the same height.

Figure 11:
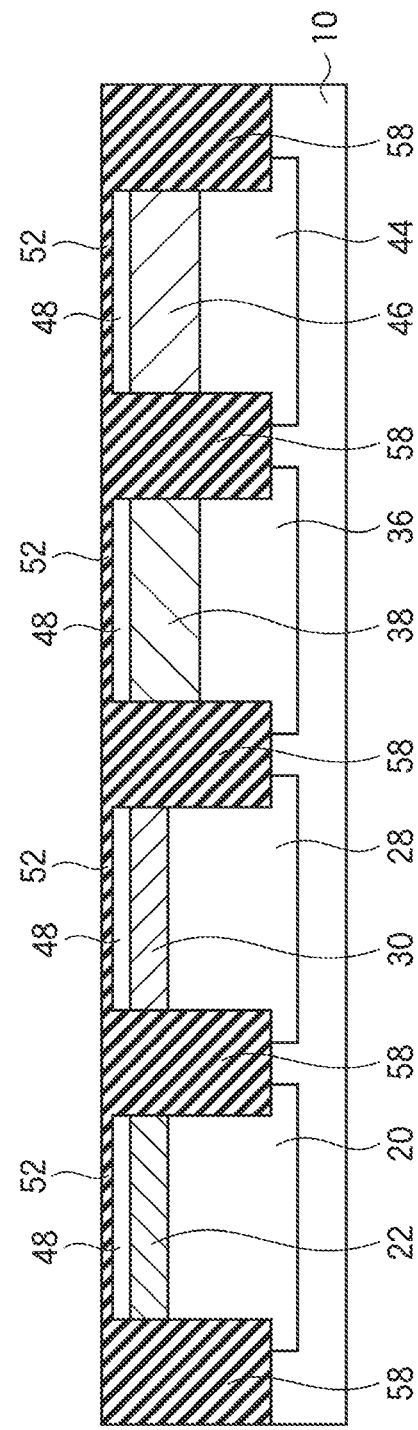
Figure 12:
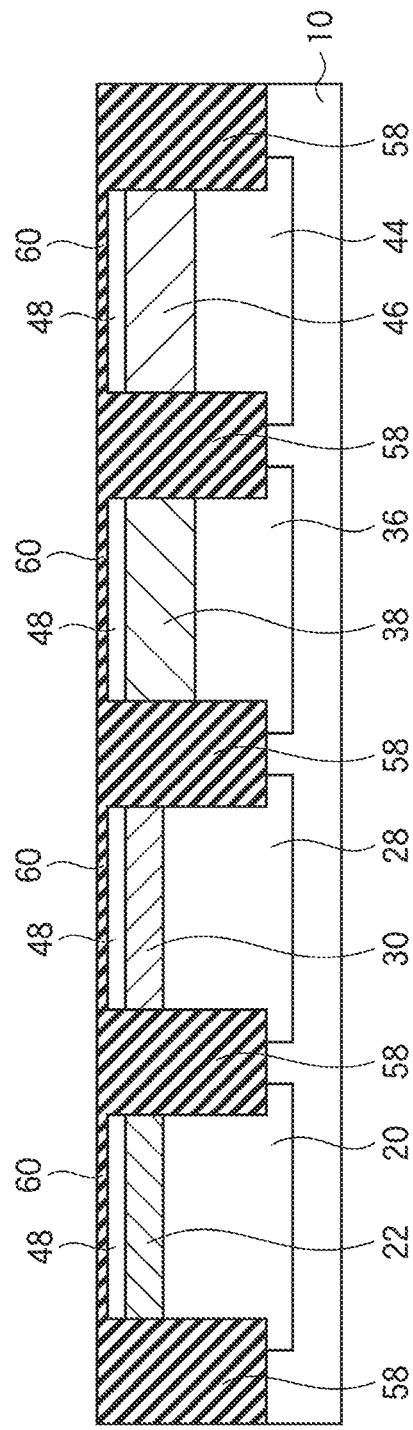

Next, by, e.g., wet etching with hot phosphoric acid, the silicon nitride film 54 is removed (FIG. 11).

Next, by wet etching using, e.g., hydrofluoric acid aqueous solution, the silicon oxide film 52 is removed. At this time, to completely remove the silicon oxide film 52, the 3 nm-film thickness silicon oxide film 52 is etched by a film thickness equivalent to a 5 nm-thickness of thermal oxidation film.

For the silicon oxide film of the device isolation insulating film 58, which has been deposited by high density plasma CVD method, the etching rate to hydrofluoric acid aqueous solution is about twice the etching rate for thermal oxidation film. If impurity ions are implanted in the silicon oxide film, although depending on an ionic species, the etching rate is further increased. High temperature thermal processing can lower the etching rate but is not preferable so as to realize steep channel impurity distributions.

In the present embodiment, in which no impurity ions are implanted in the silicon oxide film forming the device isolation insulating film 58, the etching amount of the device isolation insulating film 58 accompanying the etching of the silicon oxide film 52 can be suppressed to be as small as 10 nm.

Next, by thermal oxidation method, a silicon oxide film 60 of, e.g., a 7 nm-thickness is formed. As the processing conditions, for example, the temperature is set at 750° C., and the processing period of time is set at 52 minutes.

Next, by photolithography, a photoresist film 62 covering the high voltage NMOS transistor forming region 32 and the high voltage PMOS transistor forming region 40 and exposing the reset region is formed.

Figure 13:
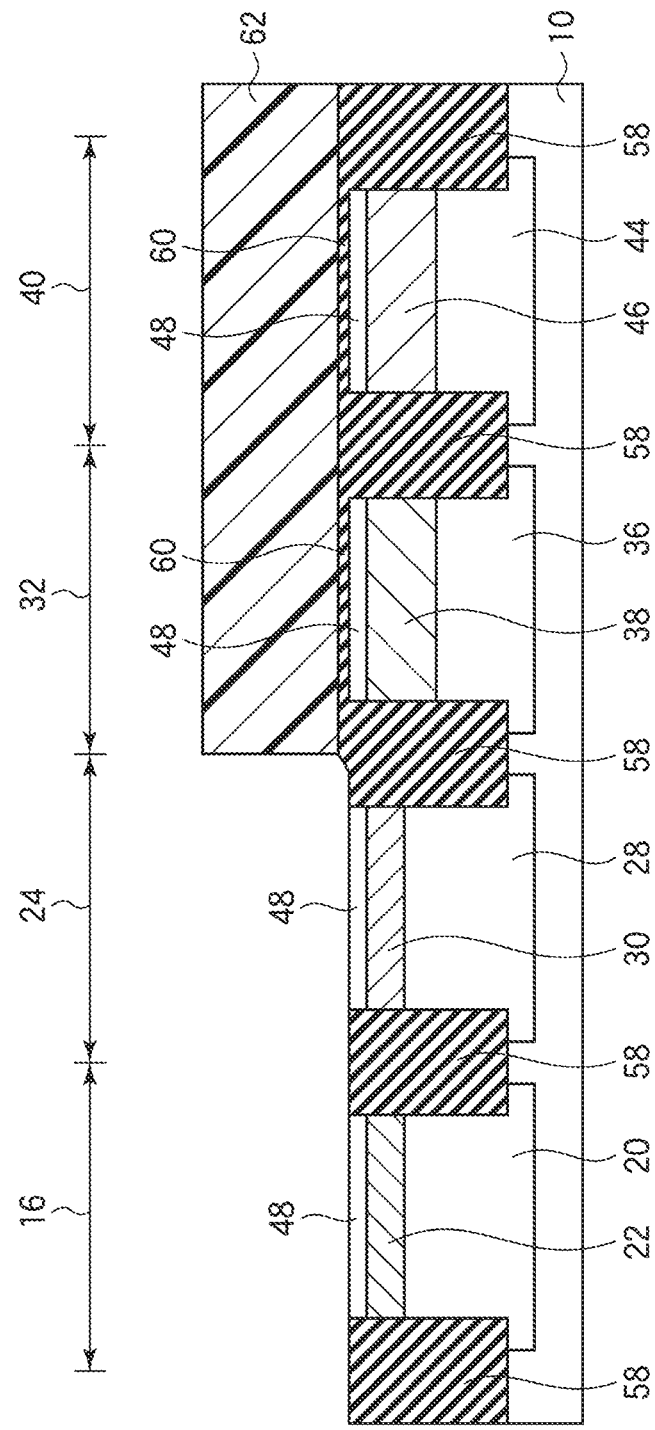

Then, by, e.g., wet etching with hydrofluoric acid aqueous solution and with the photoresist film 62 as the mask, the silicon oxide film 60 is etched. Thus, the silicon oxide film 60 in the low voltage NMOS transistor forming region 16 and the low voltage PMOS transistor forming region 24 is removed (FIG. 13). At this time, to completely remove the silicon oxide film 60, the 7 nm-thickness silicon oxide film 60 is etched by a film thickness equivalent to a 10 nm-thickness of thermal oxidation film.

For the silicon oxide film of the device isolation insulating film 58, which has been deposited by high density plasma CVD method, the etching rate to hydrofluoric acid aqueous solution is about twice the etching rate for thermal oxidation film. If impurity ions are implanted in the silicon oxide film, although depending on an ionic species, the etching rate is further increased. High temperature thermal process can lower the etching rate but is not preferable so as to realize steep channel impurity distributions.

In the present embodiment, in which no impurity ions are implanted in the silicon oxide film forming the device isolation insulating film 58, the etching amount of the device isolation insulating film 58 accompanying the etching of the silicon oxide film 60 can be suppressed to be as small as 20 nm.

Thus, the total etching amount of the device isolation insulating film 58 in removing the silicon oxide films 52, 60 can be suppressed to be as small as about 10 nm in the high voltage transistor forming regions 32, 40 and about 30 nm in the low voltage transistor forming regions 16, 24.

Then, by, e.g., asking method, the photoresist film 62 is removed.

Next, by thermal oxidation method, a silicon oxide film 64 of, e.g., a 2 nm-thickness is formed. As the processing conditions, for example, the temperature is set at 810° C., and the processing period of time is set at 8 seconds.

Next, thermal processing of, e.g., 870° C. and 13 seconds is made in NO atmosphere to introduce nitrogen into the silicon oxide films 60, 64.

Figure 14:
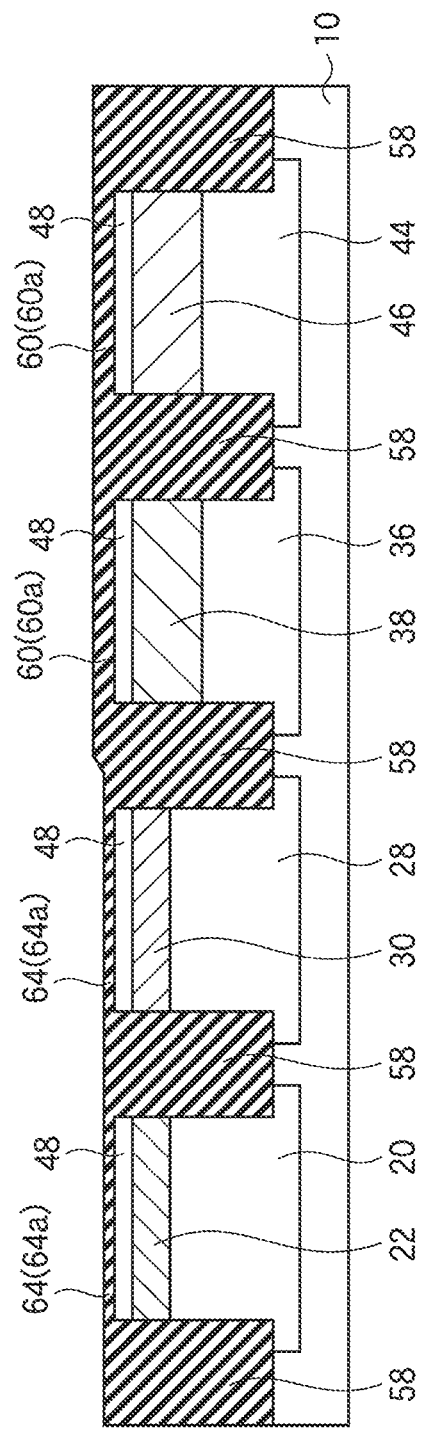

Thus, the gate insulating films 60a of the silicon oxide film 60 are formed in the high voltage NMOS transistor forming region 32 and the high voltage PMOS transistor forming region 40. In the low voltage NMOS transistors forming region 16 and the low voltage PMOS transistors forming region 24, the gate insulating films 64a of the silicon oxide film 64 thinner than the silicon oxide film 60 are formed (FIG. 14).

Then, above the entire surface, a non-doped polycrystalline silicon film of, e.g., a 100 nm-thickness is deposited by, e.g., LPCVD method. As the processing conditions, for example, the temperature is set at 605° C.

Figure 15:
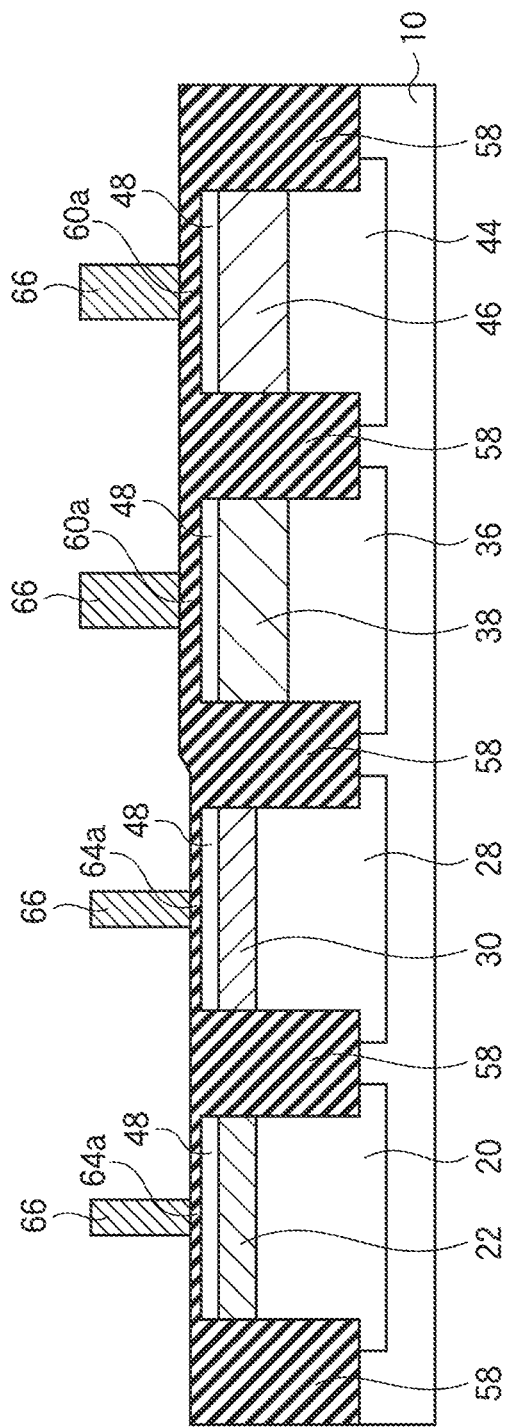

Next, by photolithography and dry etching, the polycrystalline silicon film is patterned to form the gate electrodes 66 in the respective transistor forming regions (FIG. 15).

Next, by photolithography and ion implantation, n-type impurity ions are implanted selectively in the high voltage NMOS transistor forming region 32 with the gate electrode 66 as the mask to form n-type impurity layers 68 to be the LDD regions. The n-type impurity layers 68 are formed by implanting, e.g., phosphorus ions under the conditions of 35 keV acceleration energy and $2 \times 10^{13}$ cm$^{-2}$ dose.

Next, by photolithography and ion implantation, p-type impurity ions are implanted selectively in the high voltage PMOS transistor forming region 40 with the gate electrode 66 as the mask to form p-type impurity layers 70 to be the LDD regions. The p-type impurity layers 70 are formed by implanting, e.g., boron ions under the conditions of 10 keV acceleration energy and $2 \times 10^{13}$ cm$^{-2}$ dose.

Next, by photolithography and ion implantation, n-type impurity ions are implanted selectively in the low voltage NMOS transistor forming region 16 with the gate electrode 66 as the mask to form n-type impurity layers 72 to be the extension regions. The n-type impurity layers 72 are formed by implanting, e.g., arsenic ions at 6 keV acceleration energy and $2 \times 10^{14}$ cm$^{-2}$ dose.

Figure 16:
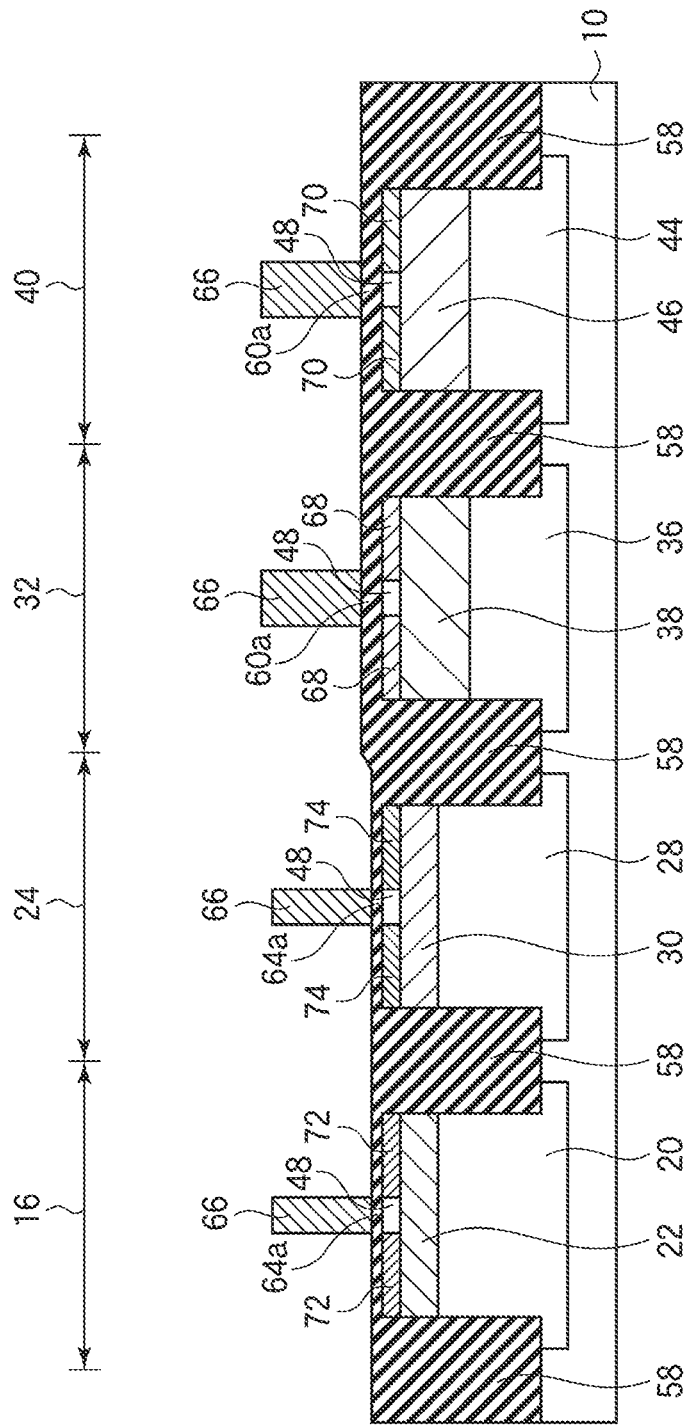

Then, by photolithography and ion implantation, p-type impurity ions are implanted selectively in the low voltage PMOS transistor forming region 24 with the gate electrode 66 as the mask to form p-type impurity layers 74 to be the extension regions (FIG. 16). The p-type impurity layers 74 are formed by implanting, e.g., boron ions at 0.6 keV acceleration energy and $7 \times 10^{14}$ cm$^{-2}$ dose.

Then, above the entire surface, a silicon oxide film of, e.g., an 80 nm-thickness is deposited by, e.g., CVD method. As the processing condition, for example, the temperature is set at 520° C.

Figure 17:
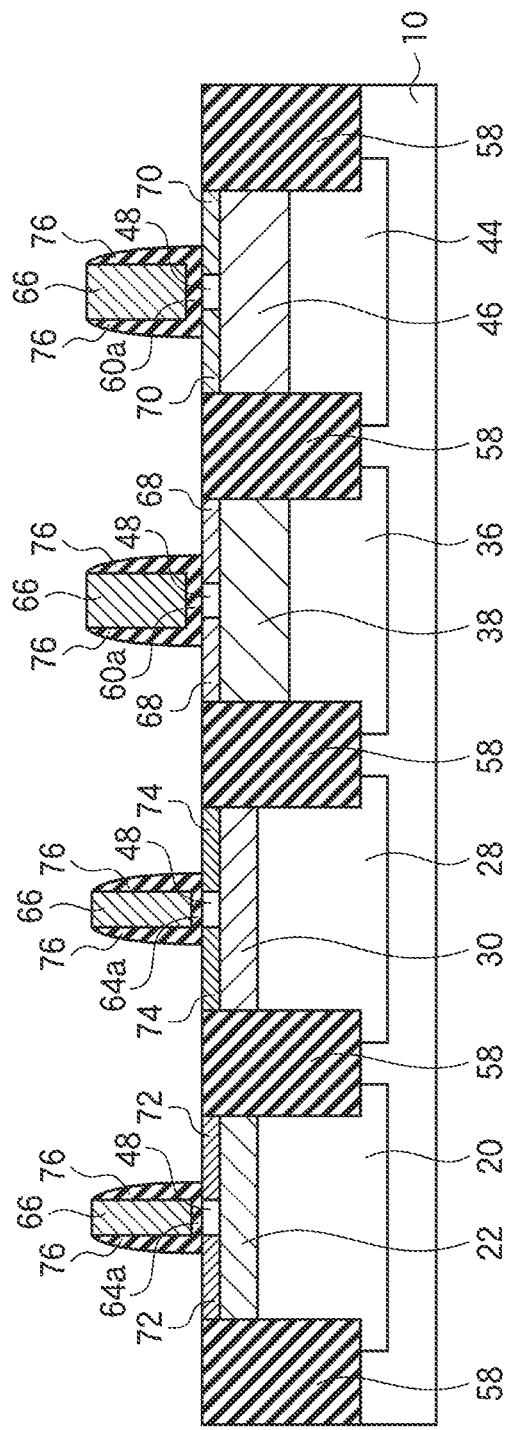

Next, the silicon oxide film deposited above the entire surface is anisotropically etched to be left selectively on the side walls of the gate electrodes 66. Thus, the sidewall spacers 76 of the silicon oxide film are formed (FIG. 17).

Next, by photolithography and ion implantation, ion implantation is made selectively in the low voltage NMOS transistor forming region 16 and the high voltage NMOS transistor forming region 32 with the gate electrodes 66 and the sidewall spacers 76 as the mask. Thus, the n-type impurity layers 78 to be the source/drain regions are formed, and n-type impurities are doped to the gate electrodes 66 of the NMOS transistors. As the conditions for the ion implantation, for example, phosphorus ions are implanted at 8 keV acceleration energy and at $1.2 \times 10^{16}$ cm$^{-2}$ dose.

Next, by photolithography and ion implantation, ion implantation is made selectively in the low voltage PMOS transistor forming region 24 and the high voltage PMOS transistor forming region 40 with the gate electrodes 66 and the sidewall spacers 76 as the mask. Thus, the p-type impurity layers 80 to be the source/drain regions are formed, and p-type impurities are doped to the gate electrodes 66 of the PMOS transistors. As the conditions for the ion implantation, for example, boron ions are ion implanted at 4 keV acceleration energy and $6 \times 10^{15}$ cm$^{-2}$ dose.

Then, rapid thermal processing of, e.g., 1025° C. and 0 second is made in an inert gas ambient atmosphere to activate the implanted impurities and diffuse the impurities in the gate electrodes 66. The thermal processing of 1025° C. and 0 second is sufficient to diffuse the impurities to the interfaces between the gate electrodes 66 and the gate insulating films.

The channel portions of the low voltage NMOS transistor can retain steep impurity distributions by carbon suppressing the diffusion of boron, and the channel portions of the low voltage PMOS transistor can retain steep impurity distributions by the slow diffusion of arsenic or antimony. On the other hand, the channel portion of the high voltage NMOS transistor, in which no carbon is implanted, the diffusion is not suppressed, and the channel portion of the high voltage PMOS transistor, in which phosphorus, whose diffusion constant is larger than arsenic or antimony, can have gradual impurity distribution.

Figure 18:
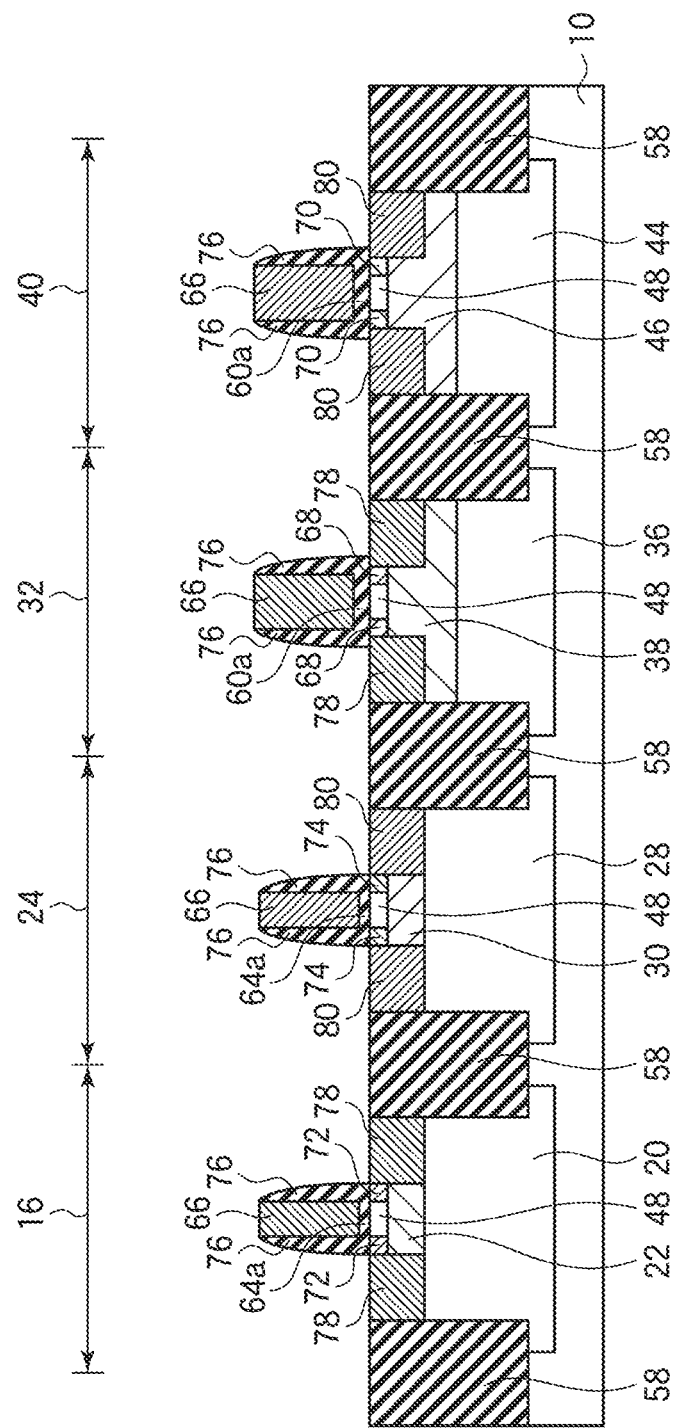

Thus, the 4 kinds of the transistors are completed on the silicon substrate 10. That is, in the low-voltage NMOS transistor forming region 16, the low-voltage NMOS transistor (LV NMOS) is formed. In the low-voltage PMOS transistor forming region 24, the low-voltage PMOS transistor (LV PMOS) is formed. In the high voltage NMOS transistor forming region, the high voltage NMOS transistor (HV NMOS) is formed. In the high voltage PMOS transistor forming region, the high voltage PMOS transistor (HV PMOS) is formed (FIG. 18).

Then, by salicide (self-aligned silicide) process, a metal silicide film 84 of, e.g., a cobalt silicide film is formed on the gate electrodes 66, the n-type impurity layers 78 and the p-type impurity layers 80.

Next, above the entire surface, a silicon nitride film of, e.g., a 50 nm-thickness is deposited by, e.g., CVD method to form the silicon nitride film as the etching stopper film.

Next, above the silicon nitride film, a silicon oxide film of, e.g., a 500 nm-thickness is deposited by, e.g., high density plasma CVD method.

Thus, the inter-layer insulating film 86 of the layer film of the silicon nitride film and the silicon oxide film is formed.

Next, the surface of the inter-layer insulating film 86 is polished by, e.g., CMP method to planarize.

Figure 19:
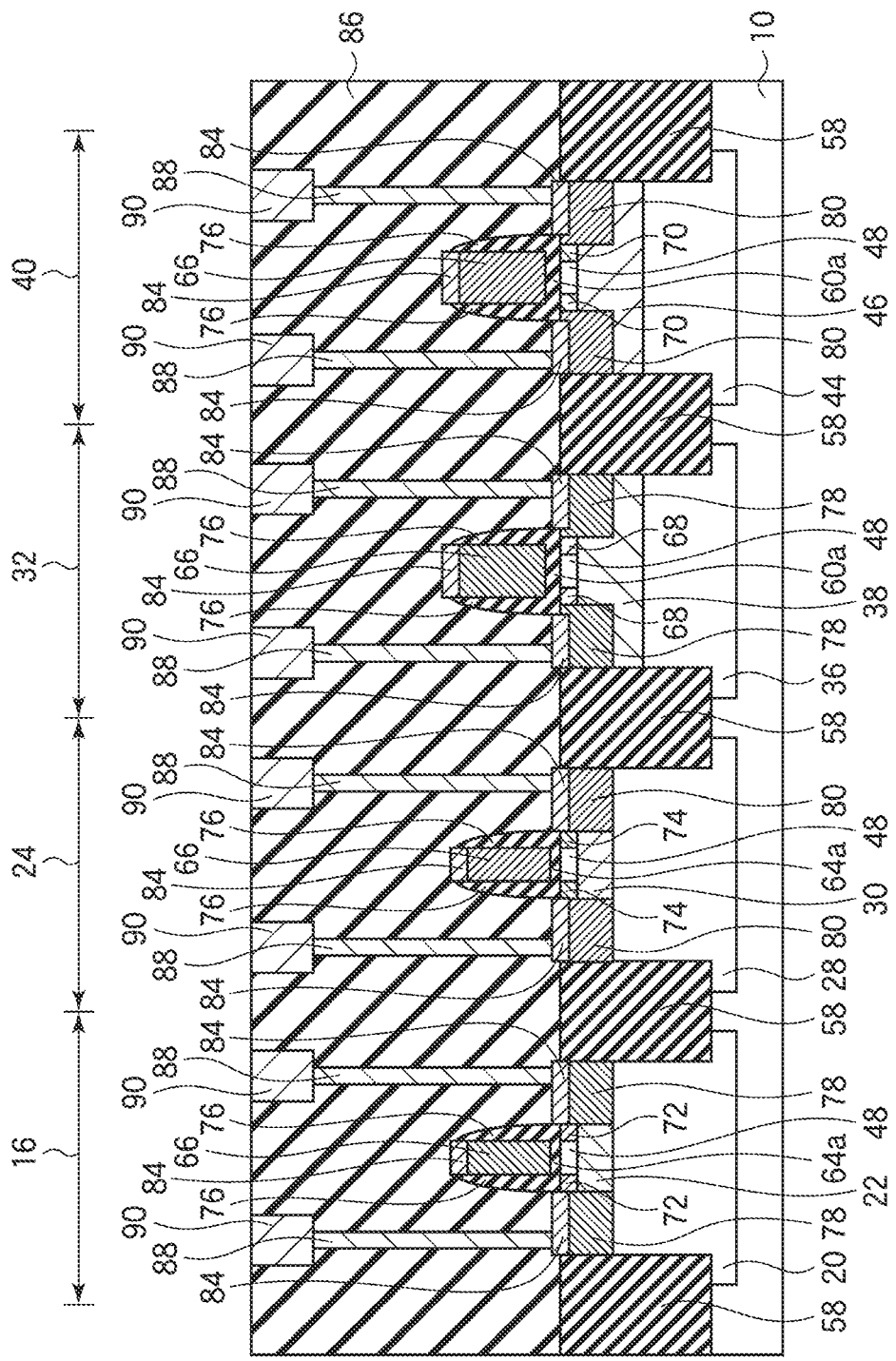

Then, the contact plugs 88 buried in the inter-layer insulating film 86, interconnections 90 connected to the contact plugs 88, and others are formed, and the semiconductor device is completed (FIG. 19).

As described above, according to the present embodiment, the highly doped impurity layer 22 of the low voltage NMOS transistor is formed of an impurity layer containing boron and carbon, and the highly-doped impurity layer of the low voltage PMOS transistor is formed of an impurity layer containing arsenic or antimony, whereby steep impurity distributions can be realized. On the other hand, the impurity layer 38 of the high voltage NMOS transistor is formed of an impurity layer containing boron, and the impurity layer 46 of the high voltage PMOS transistor is formed of an impurity layer containing phosphorus, whereby gradual impurity distributions can be realized. Thus, the low voltage transistors whose threshold voltage is stable and highly reliable can be realized, and the high voltage transistors of high junction breakdown voltage and high hot carrier immunity can be realized.

The device isolation insulating film is formed after the wells and the channel impurity layers have been formed, whereby the highly doped channel impurities are prevented from introducing into the device isolation insulating film, and the film thickness decrease of the device isolation insulating film in the etching steps can be drastically suppressed. Thus, the planarity of the substrate surface can be improved, and the generation of parasitic transistor channels can be prevented. The semiconductor device of high reliability and high performance can be realized.

A Second Embodiment

A semiconductor device and a method of manufacturing a semiconductor device according to a second embodiment will be described with reference to FIGS. 20-23. The same members of the present embodiment as those of the semiconductor device and the method of manufacturing the same according to the first embodiment illustrated in FIGS. 1 to 19 are represented by the same reference numbers not to repeat or to simplify their description.

FIGS. 20-23 are sectional views illustrating a method of manufacturing the semiconductor device according to the present embodiment.

By the method of manufacturing the semiconductor device according to the first embodiment, the etching amount of the device isolation insulating film 58 accompanying the etching can be suppressed to be as small as about 10 nm for the high voltage transistor forming regions 32, 40 and about 30 nm in the low voltage transistor forming regions 16, 24. However, the etching amount of the device isolation insulating film 58 in the low voltage transistor forming regions 16, 24 is large in comparison with the etching amount in the high voltage transistor forming regions 32, 40.

In the present embodiment, the method which can further suppress the etching amount of the device isolation insulating film 58 in the low voltage transistor forming regions 16, 24 will be described.

Figure 20:
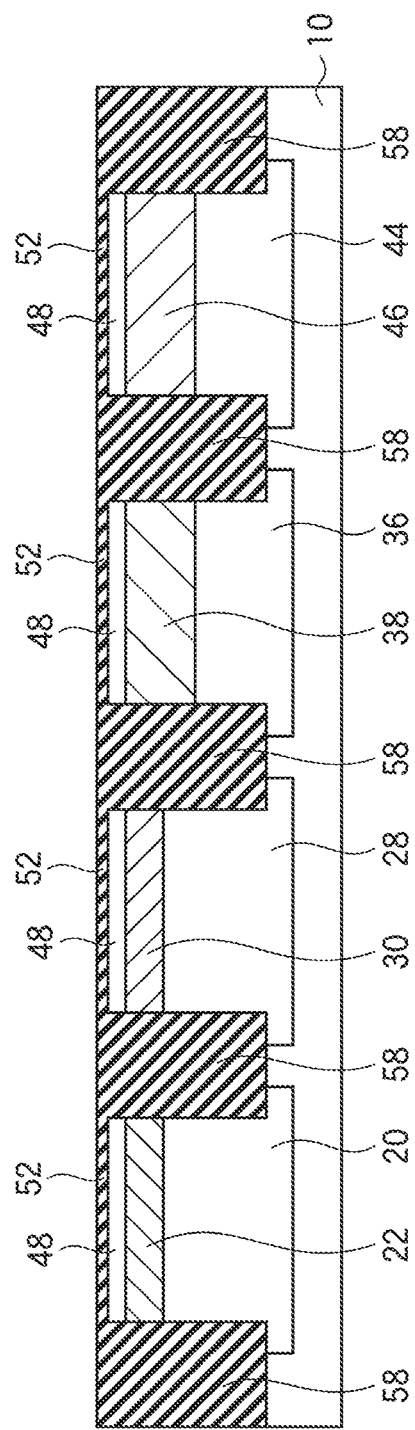
FIGS. 20-23 are sectional views illustrating a method of manufacturing the semiconductor device according to a second embodiment.

First, in the same way as in the method of manufacturing the semiconductor device according to the first embodiment illustrated in FIGS. 3 to 11, the device isolation insulating film 58 defining the active regions is formed. On the surface of the active regions, a silicon oxide film 52 of an about 3 nm-thickness remains (FIG. 20).

Next, by photolithography, a photoresist film 92 covering the low voltage NMOS transistor forming region 16 and the low voltage PMOS transistor forming region 24 and exposing the high voltage NMOS transistor forming region 32 and the high voltage PMOS transistor forming region 40 is formed.

Figure 21:
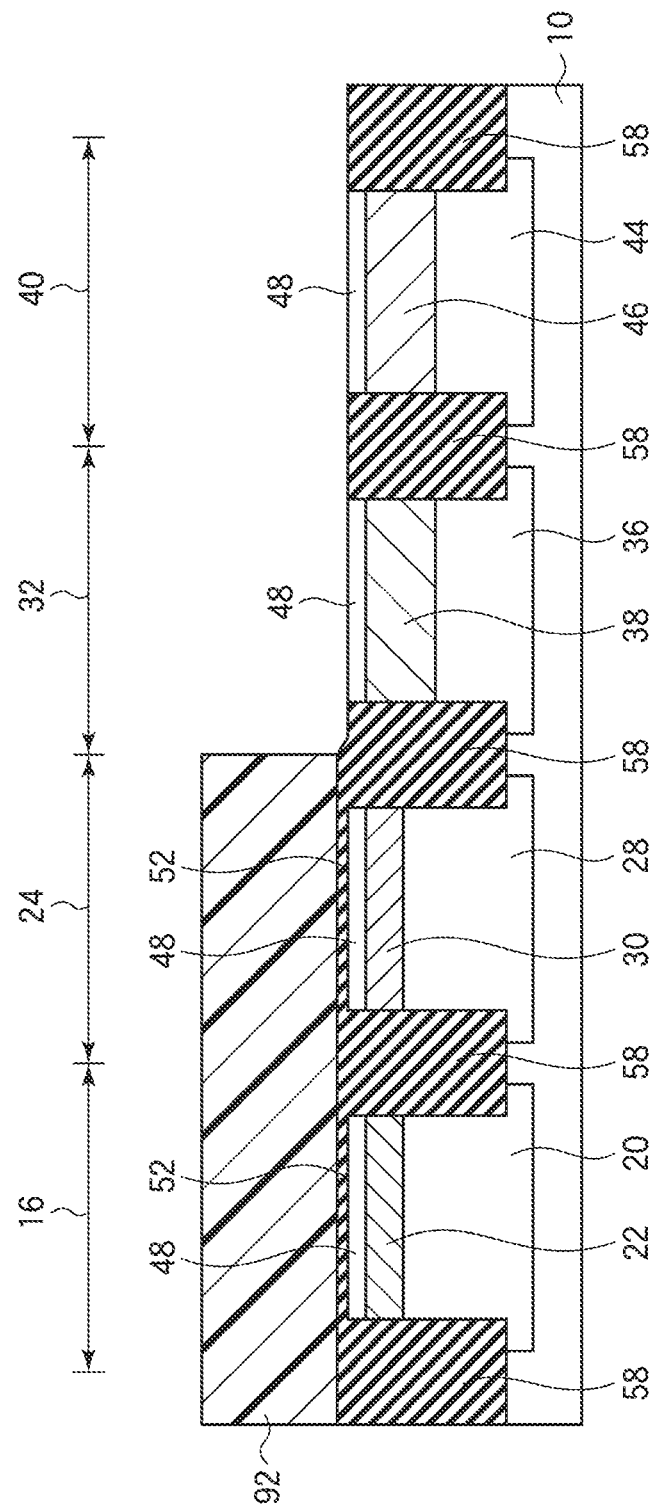

Then, by wet etching with, e.g., hydrofluoric acid aqueous solution and with the photoresist film 92 as the mask, the silicon oxide film 52 is etched. Thus, the silicon oxide film 52 in the high voltage NMOS transistor forming region 32 and the high voltage PMOS transistor forming region 40 is removed (FIG. 21).

At this time, to completely remove the silicon oxide film 52, the silicon oxide film 52 of a 3 nm-thickness is etched by a film thickness equivalent to a 5 nm-thickness of thermal oxidation film.

For the device isolation insulating film 58, which has been deposited by high density plasma CVD method, the etching rate to hydrofluoric acid aqueous solution is about twice that of thermal oxidation film. If impurity ions are implanted in the silicon oxide film, although depending on an ionic species, the etching rate is further increased. High thermal processing can decrease the etching rate but is not preferable to realize steep channel impurity distributions.

In the present embodiment, no impurity ions are implanted in the silicon oxide film forming the device isolation insulating film 58, whereby the etching amount of the device isolation insulating film 58 accompanying the etching of the silicon oxide film 52 in the high voltage transistor forming regions 32, 40 can be suppressed to be as small as 10 nm. On the other hand, in the low voltage transistor forming regions 16, 24 covered by the photoresist film 82, the device isolation insulating film 58 therein is not etched.

Then, the photoresist film 92 is removed by, e.g., asking method.

Figure 22:
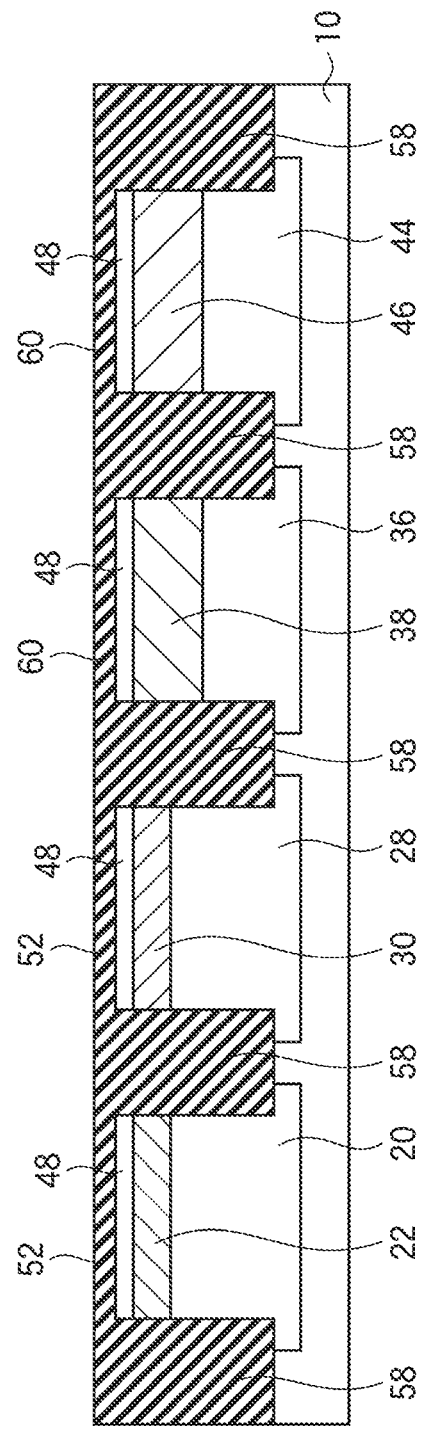

Next, by thermal oxidation method, a silicon oxide film 60 of, e.g., a 7 nm-thickness is formed (FIG. 22). As the processing conditions, for example, the temperature is set at 750° C., and the processing period of time is set at 52 minutes.

At this time, the silicon oxide film 52 remaining in the low voltage transistor forming regions 16, 24 is additionally oxidized to be about 8 nm thick.

Next, by photolithography, a photoresist film 62 covering the high voltage NMOS transistor forming region 32 and the high voltage PMOS transistor forming region 40 and exposing the low voltage NMOS transistor forming region 16 and the low voltage PMOS transistor forming region 24 is formed.

Figure 23:
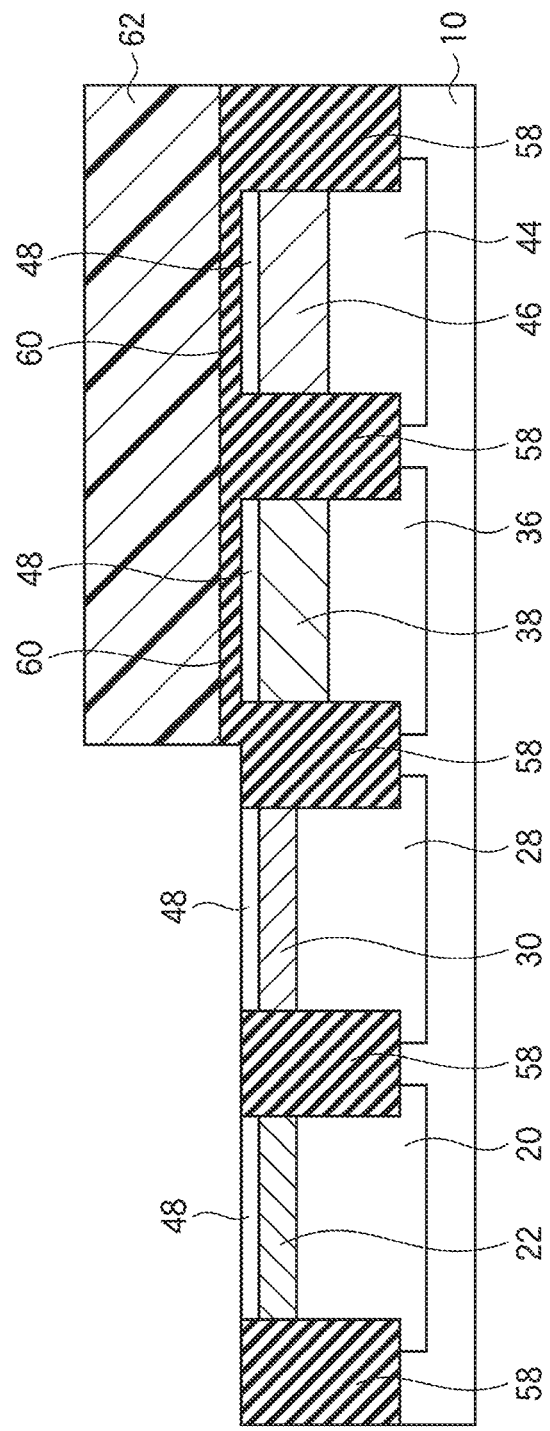

Next, by wet etching with, e.g., hydrofluoric acid aqueous solution and with the photoresist film 62 as the mask, the silicon oxide film 60 is etched. Thus, the silicon oxide film 60 in the low voltage NMOS transistor forming region 16 and the low voltage PMOS transistor forming region 24 is removed (FIG. 23). At this time, to completely remove the silicon oxide film 52, the silicon oxide film 52 of an 8 nm-thickness is etched by a film thickness equivalent to an 11 nm-thickness of thermal oxidation film.

For the device isolation insulating film 58, which has been deposited by high density plasma CVD method, the etching rate to hydrofluoric acid aqueous solution is about twice that of thermal oxidation film. If impurity ions are implanted in the silicon oxide film, although depending on an ionic species, the etching rate is further increased. High thermal processing can decrease the etching rate but is not preferable to realize steep channel impurity distributions.

In the present embodiment, no impurity ions are implanted in the silicon oxide film forming the device isolation insulating film 58, whereby the etching amount of the device isolation insulating film 58 accompanying the etching of the silicon oxide film 52 can be suppressed to be as small as 22 nm.

Thus, the total of the etching amounts of the device isolation insulating film 58 in removing the silicon oxide film 52, 60 can be suppressed to be as small as about 10 nm in the high voltage transistor forming regions 32, 40 and about 22 nm in the low voltage transistor forming regions 16. 24.

In comparison with the method of manufacturing the semiconductor device according to the first embodiment, the etching amount of the device isolation insulating film 58 in the low voltage transistor forming regions 16, 24 can be improved by about 25%.

Then, in the same way as in the method of manufacturing the semiconductor device according to the first embodiment illustrated in FIGS. 14 to 19, the semiconductor device is completed.

As described above, according to the present embodiment, before the gate insulating film of the high voltage transistors is formed, the insulating film formed in the high voltage transistor forming regions is selectively removed, whereby the film thickness decrease of the device isolation insulating film in the low voltage transistor forming regions can be drastically suppressed. Thus, the planarity of the substrate surface can be improved, and the semiconductor device of high reliability and high performance can be realized.

A First Reference Example

A method of manufacturing a semiconductor device according to a first reference example will be described with reference to FIGS. 24A to 26B. The same members of the present reference example as those of the semiconductor device and the method of manufacturing the same according to the first and the second embodiments illustrated in FIGS. 1 to 23 are represented by the same reference numbers not to repeat or to simplify the description.

FIGS. 24A to 26B are sectional views illustrating the method of manufacturing the semiconductor device according to the present reference example.

In the present reference example, the process of making the channel ion implantation in the p-type highly doped impurity layer 22 and the n-type highly doped impurity layer 30, etc. after the device isolation insulating film 58 has been formed will be described.

First, in the silicon substrate 10, the device isolation insulating film 58 is formed by STI method.

Next, above the active regions defined by the device isolation insulating film 58, the silicon oxide film 14 as the protection oxide film is formed (FIG. 24A).

Next, by photolithography and ion implantation, the p-type highly doped impurity layer 22 is formed in the low voltage NMOS transistor forming region 16.

Next, by photolithography and ion implantation, the n-type highly doped impurity layer 30 is formed in the low voltage PMOS transistor forming region 24.

Next, by photolithography and ion implantation, the p-type impurity layer 38 is formed in the high voltage NMOS transistor forming region 32.

Next, by photolithography and ion implantation, the n-type impurity layer 46 is formed in the high voltage PMOS transistor forming region 40 (FIG. 24B).

Next, thermal processing is made to recover the ion implantation damages and activate the implanted impurities.

Next, by wet etching with hydrofluoric acid aqueous solution, the silicon oxide film 14 is removed to expose the silicon substrate 10 in the active regions.

At this time, the impurities of high concentrations are introduced in the device isolation insulating film 58 by the ion implantation in forming the p-type highly doped impurity layer 22 and the n-type highly doped impurity layer 30, whereby the etching rate of the device isolation insulating film 58 is enhanced. Especially, when arsenic is ion implanted so as to form the n-type highly doped impurity layer 30 for the purpose of obtaining a steep impurity profile, the increase of the etching rate in the low voltage PMOS transistor forming region 24 is conspicuous.

Resultantly, in the low voltage NMOS transistor forming region 16 and the low voltage PMOS transistor forming region 24, the device isolation insulating film 58 is excessively etched in etching the silicon oxide film 14, and the side surfaces of the active regions are exposed.

The impurity concentrations of the p-type impurity layer 38 and the n-type impurity layer 46 are lower by about 1 place in comparison with the impurity concentrations of the p-type highly doped impurity layer 22 and the n-type highly doped impurity layer 30. Accordingly, the etched amounts of the device isolation insulating film 58 in the high voltage NMOS transistor forming region 32 and the high voltage PMOS transistor forming region 40 are relatively small.

Next, above the silicon substrate 10, the non-doped silicon layer 48 is epitaxially grown (FIG. 25A). At this time, the growth of the silicon layer 48 starts from the surface and the side surface of the active region, and crystalline defects are introduced in the parts where the silicon layers grown along different plane orientations are met, i.e., in the edges of the device isolation insulating film 58.

The crystalline defects introduced in the silicon layer 48 much influence the characteristics of the transistors, such as leakage current increases, etc., and are unpreferable.

Then, above the active regions, the silicon oxide film 60 to be the gate insulating films 60*a* for the high voltage NMOS transistor and the high voltage PMOS transistor is formed (FIG. 25B).

Figure 26A:
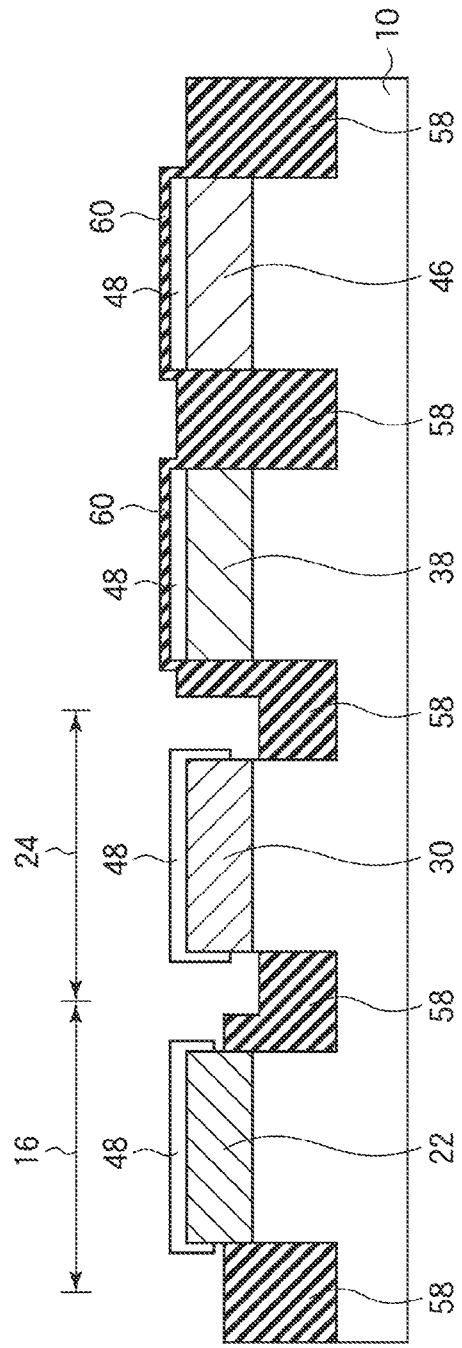

Next, by photolithography and wet etching, the silicon oxide film 60 in the low voltage NMOS transistor forming region 16 and the low voltage PMOS transistor forming region 24 is selectively removed (FIG. 26A).

At this time, the device isolation insulating film 58 is etched together with the silicon oxide film 60, and in the low voltage NMOS transistor forming region 16 and the low voltage PMOS transistor forming region 24, the lower surface of the silicon layer 48 is exposed at the ends of the device isolation insulating film 58.

Figure 26B:
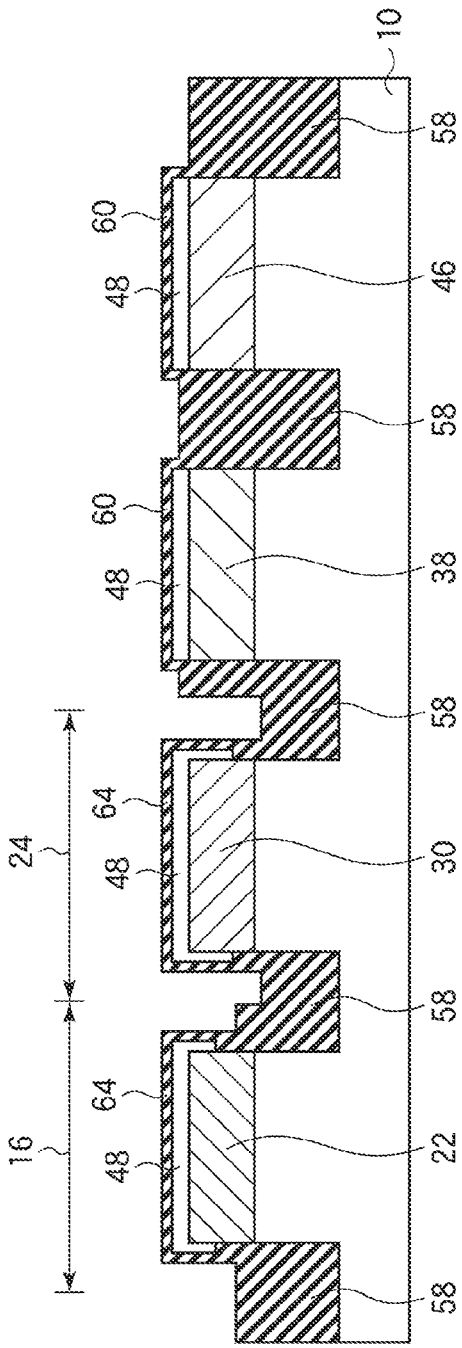

Next, above the active regions of the low voltage NMOS transistor forming region 16 and the low voltage PMOS transistor forming region 24, the silicon oxide film 64 to be the gate insulating films 64*a* is formed (FIG. 26B).

Then, when the gate electrodes 66 are formed above the gate insulating films 64*a*, below the silicon layer 48 at the edges of the device isolation insulating film 58, parasitic transistor channels opposed to the gate electrodes without the silicon layer 48 therebetween are formed. Such parasitic channels are unavoidable when the silicon layer 48 is epitaxially grown and then 2 or more kinds of the gate insulating films of different film thicknesses are formed.

The film thickness decrease of the device isolation insulating film 58 takes place also in the following etching processes. When the film thickness decrease of the device isolation insulating film 58 takes place, the planarity of the silicon substrate surface is degraded, which often causes inconveniences in processes of later steps.

A Second Reference Example

A method of manufacturing a semiconductor device according to a second reference example will be described with reference to FIGS. 27A to 32. The same members of the present reference example as those of the semiconductor device and the method of manufacturing the same according to the first and the second embodiments illustrated in FIGS. 1 to 23 are represented by the same reference numbers not to repeat or to simplify the description.

FIGS. 27A to 32 are sectional views illustrating the method of manufacturing the semiconductor device according to the present reference example.

In the present reference example, the process of forming the device isolation insulating film 58 after the p-type highly doped impurity layers 22 and the n-type highly doped impurity layers 30 have been formed will be described.

First, photolithography and etching, the trench 12 to be used as the mark for the mask alignment is formed in a region other than the product to be formed region of the silicon substrate 10.

Next, above the entire surface of the silicon substrate 10, the silicon oxide film 14 as the protection film for the surface of the silicon substrate 10 is formed (FIG. 27A).

Then, by photolithography and ion implantation, the p-well 20 and the p-type highly doped impurity layer 22 are formed in the low voltage NMOS transistor forming region 16 and the high voltage NMOS transistor forming region 32. The p-well 20 and the p-type highly doped impurity layer 22 are formed, e.g., by ion implanting double boron or boron fluoride ($BF_2$).

Next, by photolithography and ion implantation, the n-well 28 and the n-type highly doped impurity layer 30 are formed in the low voltage PMOS transistor forming region 24 and the high voltage PMOS transistor forming region 40 (FIG. 27B). The n-well 28 and the n-type highly doped impurity layer 30 are formed, e.g., by ion implanting double phosphorus, arsenic or antimony (Sb).

Next, thermal processing is made to recover the ion implantation damage and activate the implanted impurities.

Next, by wet etching with hydrofluoric acid aqueous solution, the silicon oxide film 14 is removed.

Figure 28A:
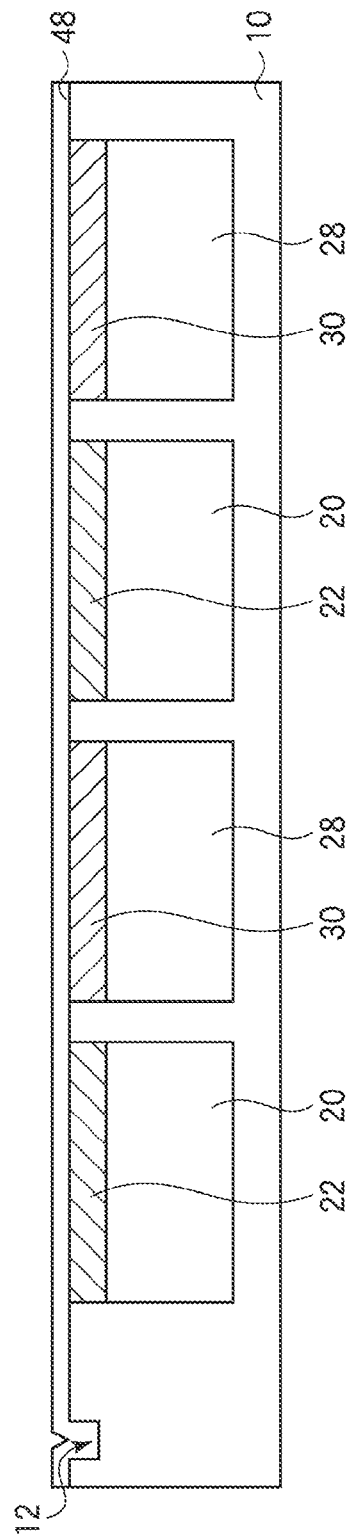

Then, above the silicon substrate, the non-doped silicon layer 48 is epitaxially grown (FIG. 28A).

Figure 28B:
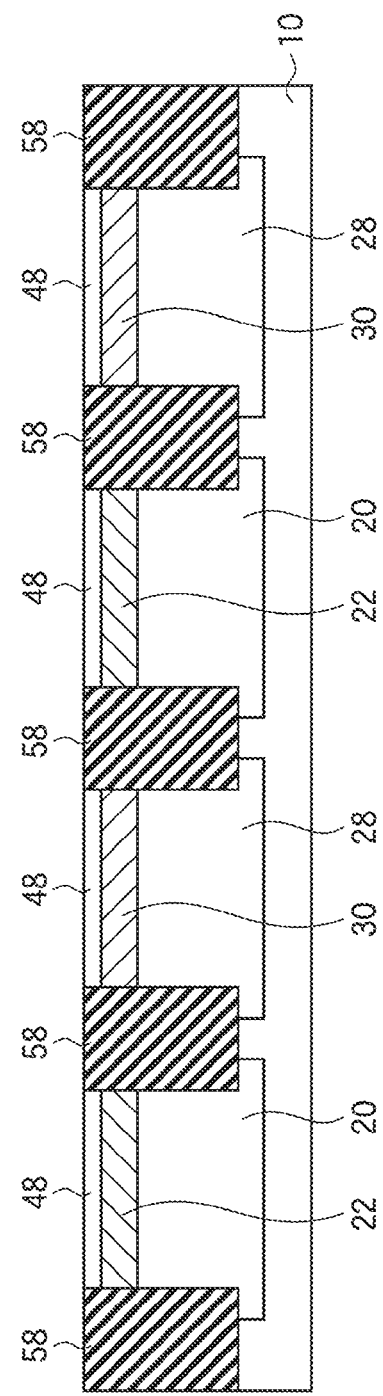

Next, by STI method, the device isolation insulating film 58 is formed in the silicon substrate 10 and the silicon layer 48 (FIG. 28B).

Figure 29A:
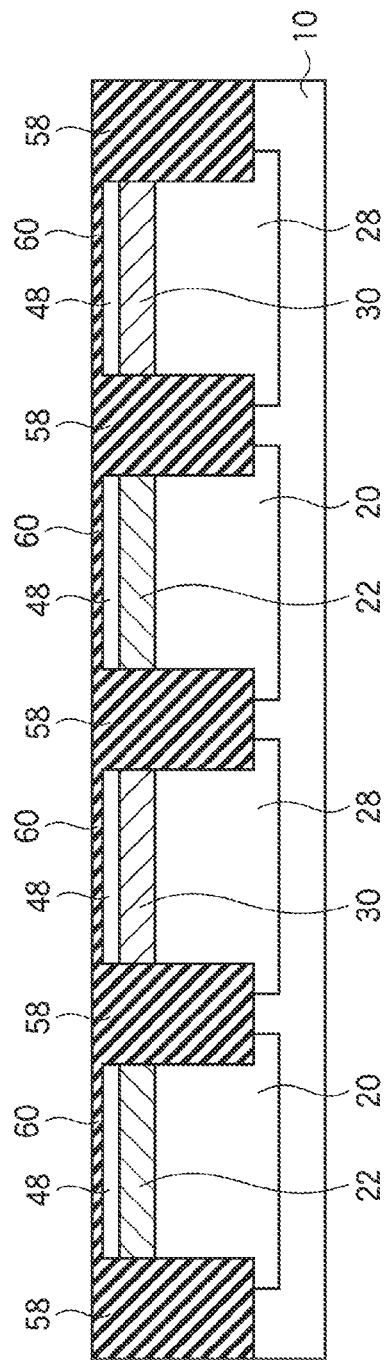

Next, above the active regions, the silicon oxide film 60 to be the gate insulating films 60a of the high voltage NMOS transistor and the high voltage PMOS transistors is formed (FIG. 29A).

Figure 29B:
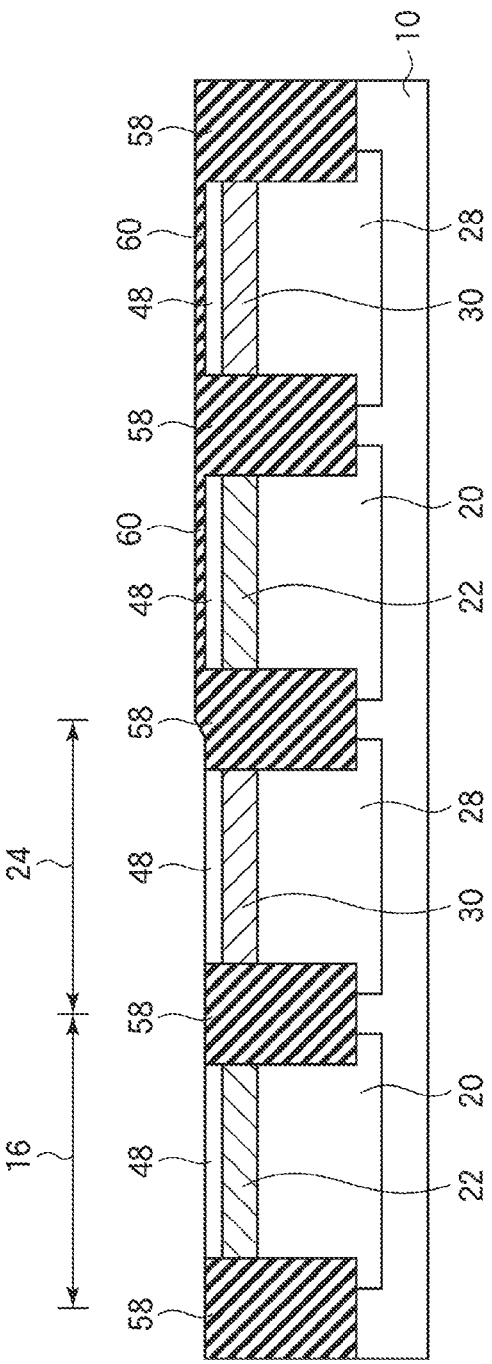

Then, by photolithography and wet etching, the silicon oxide film 60 in the low voltage NMOS transistor forming region 16 and the low voltage PMOS transistor forming region 24 is selectively removed (FIG. 29B).

Next, above the active regions of the low voltage NMOS transistor forming region 16 and the low voltage PMOS transistor forming region 24, the silicon oxide film 64 to be the gate insulating films 64a is formed (FIG. 30A).

Then, above the entire surface, a polycrystalline silicon film 66a is formed.

Next, by photolithography and ion implantation, an n-type impurity ions are implanted into the polycrystalline silicon film 66a in the low voltage NMOS transistor forming region 16 and the high voltage NMOS transistor forming region 32. Into the polycrystalline silicon film 66a in the low voltage PMOS transistor forming region 24 and the high voltage PMOS transistor forming 40, a p-type impurity ions are implanted (FIG. 30B).

Next, the polycrystalline silicon film 66a is patterned to form the gate electrodes 66 in the respective transistor forming regions.

Figure 31A:
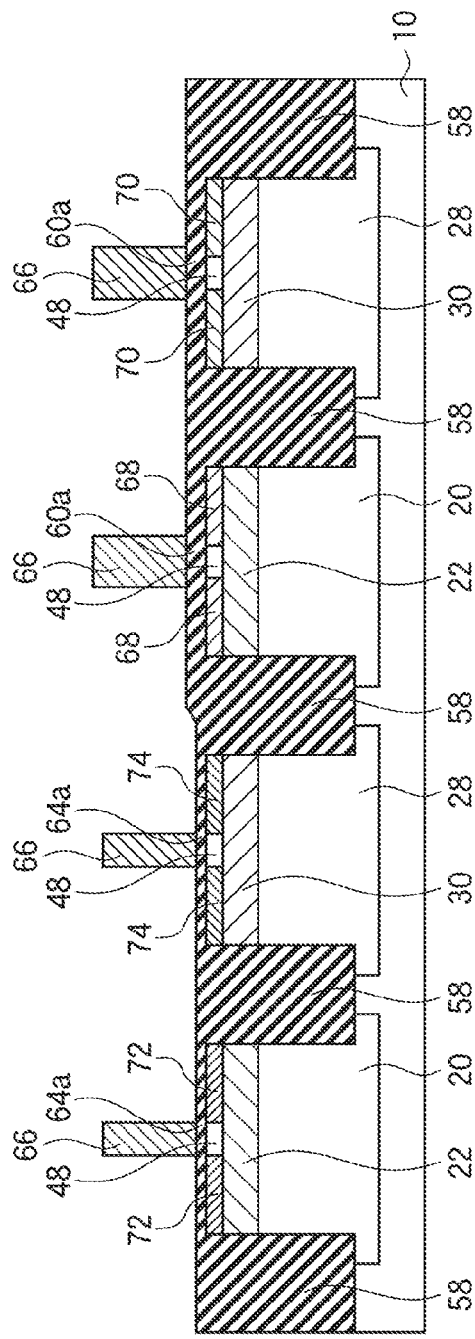

Next, by photolithography and ion implantation, n-type impurity layers 72 to be the extension regions are formed in the low voltage NMOS transistor forming region 16. In the low voltage PMOS transistor forming region 24, p-type impurity layers 74 to be the extension regions are formed. In the high voltage NMOS transistor forming region 32, n-type impurity layers 68 to be the LDD regions are formed. In the high voltage PMOS transistor forming region 40, p-type impurity layer 70 to be the LDD regions are formed (FIG. 31A).

Figure 31B:
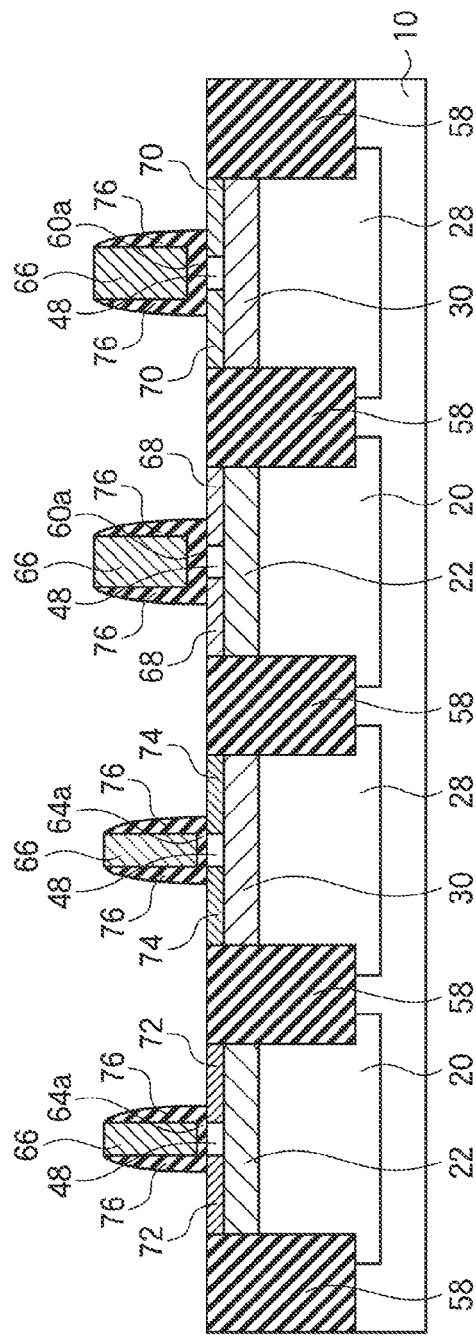

Next, a silicon oxide film is deposited and anisotropically etched to form the sidewall spacers 68 on the side walls of the gate electrodes 66 (FIG. 31B).

Figure 32:
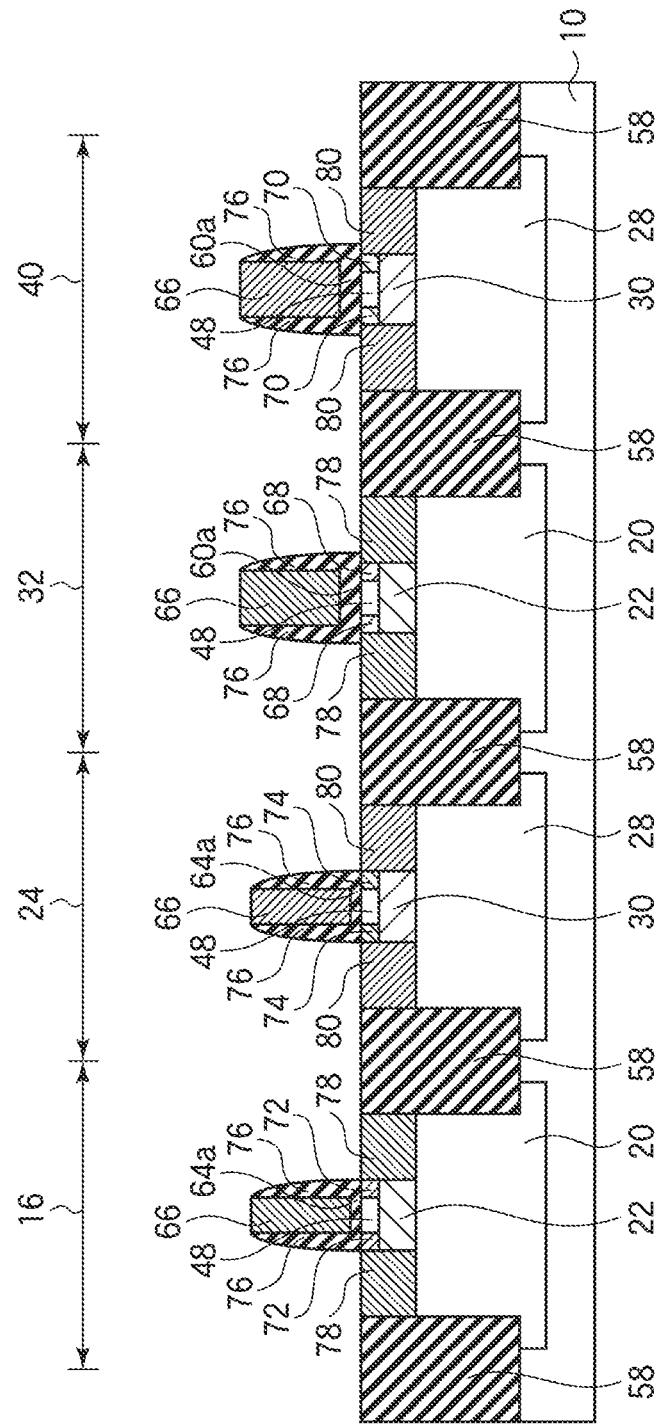

Next, by photolithography and ion implantation, n-type impurity layers 78 to be the source/drain regions are formed in the low voltage NMOS transistor forming region 16 and the high voltage NMOS transistor forming region 32. In the low voltage PMOS transistor forming region 24 and the high voltage PMOS transistor forming region 40, p-type impurity layers 80 to be the source/drain regions are formed (FIG. 32).

Next, thermal processing is made to activate the implanted impurities.

Thus, above the silicon substrate 10, the low voltage NMOS transistor, the low voltage PMOS transistor, the high voltage NMOS transistor and the high voltage PMOS transistor are formed.

In the present reference example, the wells (including the channel impurity layer) of the low voltage transistors and the wells (including the channel impurity layer) of the high voltage transistors are simultaneously formed. However, steep impurity distributions are required in the low voltage transistors, but the channel impurity layer of the high voltage transistors are not required to have steep impurity distributions. The steep distributions cause the decrease of the junction breakdown voltage and the degradation of the hot carrier immunity and is not preferable. In view of this, it is preferable to form the wells of the low voltage transistors and the wells of the high voltage transistors are formed separately.

Modified Embodiments

The above-described embodiment can cover other various modifications.

For example, in the above-described embodiments, in forming the p-type highly doped impurity layer 22, germanium ions are implanted for the amorphization. The ion species to be used for the amorphization is not limited to this. For example, silicon, nitrogen, argon, xenon or others may be used.

In the above-described embodiment, as the base semiconductor substrate, a silicon substrate is used, but the base semiconductor substrate may not be essentially a bulk silicon substrate. Other semiconductor substrates, such as SOI substrate, etc., may be used.

In the above-described embodiment, as the epitaxially semiconductor layer, a silicon layer is used, but the silicon layer is not essential. In place of the silicon layer, other semiconductor layers, such as SiGe layer, SiC layer, etc., may be used.

The structure, the constituent material, the manufacturing conditions, etc. of the semiconductor device described in the embodiment described above are one example and can be changed or modified suitably in accordance with the technical common sense, etc. of those skilled in the art.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A method of manufacturing a semiconductor device comprising:
    forming a first impurity layer in a first region of a semiconductor substrate by implanting a first impurity of a first conductivity type in the first region;
    forming a second impurity layer in a second region of the semiconductor substrate by implanting a second impurity of the first conductivity type in the second region, a diffusion constant of the second impurity being smaller than a diffusion constant of the first impurity;
    forming a semiconductor layer above the semiconductor substrate after forming the second impurity layer;
    forming a first gate insulating film above the semiconductor layer in the first region and the second region;
    removing the first gate insulating film in the second region;
    forming a second gate insulating film thinner than the first gate insulating film above the semiconductor layer in the second region; and
    forming a first gate electrode above the first gate insulating film and a second gate electrode above the second gate insulating film, wherein
    a concentration of the first impurity in the semiconductor layer of the first region is lower than a concentration of the first impurity in the first impurity layer, and
    a concentration of the second impurity in the semiconductor layer of the second region is lower than a concentration of the second impurity in the second impurity layer.

2. The method of manufacturing a semiconductor device according to claim 1, further comprising:
    forming a first source/drain region of a second conductivity type in the semiconductor layer in the first region after forming the second gate insulating film, and
    forming a second source/drain region of the first conductive type in the semiconductor layer in the second region after forming the second gate insulating film.

3. The method of manufacturing a semiconductor device according to claim 1, further comprising:
    forming a first device isolation insulating film and a second device isolation insulating film in the semiconductor substrate after forming the semiconductor layer, the first device isolation insulating film and the second device isolation insulating film being surrounding the first region and the second region respectively.

4. The method of manufacturing a semiconductor device according to claim 1, wherein
    the first impurity is phosphorus, and
    the second impurity is arsenic or antimony.

5. A method of manufacturing a semiconductor device comprising:
    forming a first impurity layer in a first region of a semiconductor substrate by implanting a first impurity of a first conductivity type in the first region;
    forming a second impurity layer in a second region of the semiconductor substrate by implanting the first impurity and a third impurity which suppresses a diffusion of the first impurity in the second region, a diffusion constant of the second impurity being smaller than a diffusion constant of the first impurity;
    forming a semiconductor layer above the semiconductor substrate after forming the second impurity layer;
    forming a first gate insulating film above the semiconductor layer in the first region and the second region;
    removing the first gate insulating film in the second region;
    forming a second gate insulating film thinner than the first gate insulating film above the semiconductor layer in the second region; and
    forming a first gate electrode above the first gate insulating film and a second gate electrode above the second gate insulating film, wherein
    a concentration of the first impurity in the semiconductor layer of the first region is lower than a concentration of the first impurity in the first impurity layer, and
    a concentration of the first impurity in the semiconductor layer of the second region is lower than a concentration of the first impurity in the second impurity layer.

6. The method of manufacturing a semiconductor device according to claim 5, wherein
    the first impurity is boron, and
    the third impurity is carbon.

7. The method of manufacturing a semiconductor device according to claim 5, wherein
    forming the second impurity layer is at least performed by implanting germanium in the semiconductor substrate of the second region, implanting the first impurity in the semiconductor substrate of the second region after implanting germanium, and implanting the third impurity in the semiconductor substrate of the second region after implanting germanium.

8. The method of manufacturing a semiconductor device according to claim 5, further comprising:
    forming a first source/drain region of a second conductivity type in the semiconductor layer in the first region after forming the second gate insulating film, and
    forming a second source/drain region of the first conductive type in the semiconductor layer in the second region after forming the second gate insulating film.

9. The method of manufacturing a semiconductor device according to claim 5, further comprising:
    forming a first device isolation insulating film and a second device isolation insulating film in the semiconductor substrate after forming the semiconductor layer, the first device isolation insulating film and the second device isolation insulating film being surrounding the first region and the second region respectively.

* * * * *